United States Patent
Kim et al.

(10) Patent No.: US 7,763,941 B2
(45) Date of Patent: Jul. 27, 2010

(54) INTEGRATED CIRCUIT DEVICE HAVING INPUT/OUTPUT ELECTROSTATIC DISCHARGE PROTECTION CELL EQUIPPED WITH ELECTROSTATIC DISCHARGE PROTECTION ELEMENT AND POWER CLAMP

(75) Inventors: Han-gu Kim, Seongnam-si (KR); Ki-tae Lee, Seongnam-si (KR); Jae-hyok Ko, Suwon-si (KR); Woo-sub Kim, Suwon-si (KR); Sung-pil Jang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 505 days.

(21) Appl. No.: 11/897,435

(22) Filed: Aug. 30, 2007

(65) Prior Publication Data

US 2008/0042206 A1 Feb. 21, 2008

Related U.S. Application Data

(62) Division of application No. 10/929,057, filed on Aug. 27, 2004, now Pat. No. 7,280,329.

(30) Foreign Application Priority Data

Aug. 27, 2003 (KR) .................................. 03-59483

(51) Int. Cl.
H01L 23/62 (2006.01)
(52) U.S. Cl. .............................. 257/355; 257/E27.016; 361/56
(58) Field of Classification Search .................. 257/355, 257/173, E27.016; 361/91.5, 56
See application file for complete search history.

(56) References Cited

U.S. PATENT DOCUMENTS

| | | | |
|---|---|---|---|
| 5,610,790 A | 3/1997 | Staab et al. | |
| 5,617,283 A | 4/1997 | Krakauer et al. | |
| 5,714,784 A | 2/1998 | Ker et al. | |
| 5,917,689 A | 6/1999 | English et al. | |
| 6,060,752 A | 5/2000 | Williams | |
| 6,104,588 A | 8/2000 | Hariton et al. | |
| 6,329,694 B1* | 12/2001 | Lee et al. | 257/372 |
| 6,385,021 B1 | 5/2002 | Takeda et al. | |
| 6,559,508 B1 | 5/2003 | Lin et al. | |
| 6,621,680 B1 | 9/2003 | Segervall | |
| 6,707,109 B2 | 3/2004 | Hayashida | |

(Continued)

FOREIGN PATENT DOCUMENTS

KR 2000-0059751 5/2000

(Continued)

*Primary Examiner*—Wael Fahmy
*Assistant Examiner*—Paul E Patton
(74) *Attorney, Agent, or Firm*—Mills & Onello, LLP

(57) ABSTRACT

There is provided an integrated circuit device having an input/output electrostatic discharge (I/O ESD) protection cell. The integrated circuit device includes an I/O ESD protection cell comprising a $V_{DD}$ ESD protection element connected between an I/O pad and a $V_{DD}$ line, a ground voltage ($V_{SS}$) ESD protection element connected between the I/O pad and a $V_{SS}$ line, and a power clamp element connected between the $V_{DD}$ line and the $V_{SS}$ line, and wherein the $V_{DD}$ ESD protection element, the power clamp element, and the $V_{SS}$ ESD protection element in the I/O ESD protection cell are adjacent to each other so they can be connected in a straight line or are arranged to partially overlap.

37 Claims, 23 Drawing Sheets

U.S. PATENT DOCUMENTS

| | | |
|---|---|---|
| 6,724,603 B2 | 4/2004 | Miller et al. |
| 7,027,275 B2 | 4/2006 | Smith |
| 2002/0017690 A1 | 2/2002 | Hayashida |
| 2006/0028776 A1 | 2/2006 | Stockinger et al. |
| 2006/0050453 A1 | 3/2006 | Duvvury et al. |
| 2007/0097581 A1 | 5/2007 | Khazhinsky et al. |

FOREIGN PATENT DOCUMENTS

| | | |
|---|---|---|
| KR | 2002-0020632 | 3/2002 |
| KR | 2002-0087966 | 11/2002 |
| WO | WO 96/22613 | 7/1996 |
| WO | WO 01/11750 A1 | 2/2001 |
| WO | WO 01/78148 A1 | 10/2001 |

* cited by examiner

INTEGRATED CIRCUIT DEVICE HAVING INPUT/OUTPUT ELECTROSTATIC DISCHARGE PROTECTION CELL EQUIPPED WITH ELECTROSTATIC DISCHARGE PROTECTION ELEMENT AND POWER CLAMP

This application is a divisional of U.S. application Ser. No. 10/929,057, filed Aug. 27, 2004, which relies for priority upon Korean Patent Application No. 2003-59483, filed on Aug. 27, 2003, in the Korean Intellectual Property Office, the disclosure of which is incorporated herein in its entirety by reference.

BACKGROUND OF THE INVENTION

1. Field of the Invention

The present invention relates to an integrated circuit device having an electrostatic discharge (ESD) protection circuit, and more particularly, to an integrated circuit device having an input/output (I/O) ESD protection cell that occupies a small area and performs an ESD protection function.

2. Description of Related Art

In general, ESD protection levels are determined by the composition of an ESD protection circuit, a layout for realizing the ESD protection circuit in an actual integrated circuit device, and a fabricating process used to fabricate the integrated circuit device. While ESD evaluation standards are the same irrespective of the type of integrated circuit device, the size of the integrated circuit device becomes increasingly small and the fabricating process becomes increasingly complicated as the degree of integration of the integrated circuit device becomes higher. Accordingly, it is necessary to develop an ESD protection circuit to effectively perform an ESD protection function in a small area using a fundamental layout design rule determined by a fabricating process.

Currently, most integrated circuit devices include ESD protection circuits for preventing the electrical characteristics of elements from changing or deteriorating due to Human Body Model (HBM) and Machine Model (MM) electrostatic electricity injected into integrated circuit devices when a charged human or metal object touches the integrated circuit devices.

FIG. 1 shows an ESD protection circuit widely used in a conventional integrated circuit device. The integrated circuit device includes a power supply voltage ($V_{DD}$) line 1 connected to a $V_{DD}$ pad 1a and a ground voltage ($V_{SS}$) line 2 connected to a $V_{SS}$ pad 2a. An I/O ESD protection cell 3 comprises a $V_{DD}$ ESD protection element 3b and a $V_{SS}$ ESD protection element 3c, which are directly connected to an I/O pad 3a. A power clamp 4 is connected between the $V_{DD}$ pad 1a and the $V_{SS}$ pad 2a to form a path through which an electrostatic current can flow.

Diodes D1 and D2 are widely used as the $V_{DD}$ ESD protection element 3b and the $V_{SS}$ ESD protection element 3c. Since the diodes D1 and D2 have excellent forward characteristics but poor reverse characteristics, the areas of the diodes D1 and D2 should be sufficiently large to be used as ESD protection elements. However, as the integration degree and minuteness degree of an integrated circuit device become increasingly high, the pitch and area of a region for the I/O ESD protection cell 3 are reduced and thus a region for the diodes D1 and D2 is also reduced. Accordingly, it becomes difficult to satisfy ESD protection characteristics in a given area.

SUMMARY OF THE INVENTION

The present invention provides an integrated circuit device having an I/O ESD protection cell that occupies a small area and performs an ESD protection function.

According to an aspect of the present invention, there is provided an integrated circuit device having an I/O ESD protection cell, wherein the I/O ESD protection cell comprises a power supply voltage ($V_{DD}$) ESD protection element connected between an I/O pad and a $V_{DD}$ line; a ground voltage ($V_{SS}$) ESD protection element connected between the I/O pad and a $V_{SS}$ line; and a power clamp element connected between the $V_{DD}$ line and the $V_{SS}$ line. The $V_{DD}$ ESD protection element, the power clamp element, and the $V_{SS}$ ESD protection element in the I/O ESD protection cell are adjacent to each other so they can be connected in a straight line or are arranged to partially overlap.

In one embodiment, the integrated circuit device of of the invention includes a plurality of I/O pads, wherein the I/O ESD protection cell is provided for each of the I/O pads, and wherein the pitch and height of the I/O ESD protection cell is determined depending on the pitch and height of the I/O pad.

In one embodiment, the power clamp element is arranged between the $V_{DD}$ ESD protection element and the $V_{SS}$ ESD protection element.

In one embodiment, at least a portion of the I/O ESD protection cell is formed below the I/O pad.

In one embodiment, the I/O ESD protection cell is formed below the I/O pad.

In one embodiment, elements constituting the I/O ESD protection cell are comprised of diodes, MOS transistors, bipolar transistors, field transistors, thyristors, or a combination thereof.

According to another aspect of the present invention, there is provided an integrated circuit device having an I/O ESD protection cell. Herein, the I/O ESD protection cell comprises a power supply voltage ($V_{DD}$) ESD protection element formed within a second conductivity type well in a first conductivity type substrate and comprising a first conductivity type active region connected to an I/O pad and a second conductivity type active region connected to a $V_{DD}$ line; a power clamp element formed within the second conductivity type well in the first conductivity type substrate and comprising the second conductivity type active region connected to the $V_{DD}$ line and the first conductivity type active region connected to a ground voltage ($V_{SS}$) line; and a $V_{SS}$ ESD protection element formed within a first conductivity type well in the first conductivity type substrate and comprising the first conductivity type active region connected to the $V_{SS}$ line and the second conductivity type active region connected to the I/O pad.

In one embodiment, the power clamp element is arranged between the $V_{DD}$ ESD protection element and the $V_{SS}$ ESD protection element.

In one embodiment, the $V_{SS}$ ESD protection element further comprises the second conductivity type well surrounding the second conductivity type active region.

In one embodiment, at least a portion of the I/O ESD protection cell is formed below the I/O pad.

In one embodiment, the I/O ESD protection cell is formed below the I/O pad.

In one embodiment, the first conductivity type active region of the $V_{DD}$ ESD protection element is divided into at least two regions, each of the regions being connected to the I/O pad, and the second conductivity type active region is separated from the first conductivity type active region divided into at least two regions and surrounds the first conductivity type active region in a closed-loop form to form at least two diodes connected in parallel.

In one embodiment, the second conductivity type active region of the $V_{DD}$ ESD protection element is divided into at least two regions, each of the regions being connected to the I/O pad, and the first conductivity type active region is separated from the second conductivity type active region divided into at least two regions and surrounds the second conductivity type active region in a closed-loop form to form at least two diodes connected in parallel.

In one embodiment, the second conductivity type active region of the power clamp element is separated from the first conductivity type active region and surrounds the first conductivity type active region in a closed-loop form.

According to yet another aspect of the present invention, there is provided an integrated circuit device having an I/O ESD protection cell. Herein, the I/O ESD protection cell comprises a power supply voltage ($V_{DD}$) ESD protection element formed within a second conductivity type well in a first conductivity type substrate and comprising a first conductivity type active region connected to an I/O pad and a second conductivity type active region connected to a $V_{DD}$ line; a power clamp element formed within a first conductivity type well in the first conductivity type substrate and comprising the second conductivity type active region connected to the $V_{DD}$ line and the first conductivity type active region connected to a ground voltage ($V_{SS}$) line; and a $V_{SS}$ ESD protection element formed within the first conductivity type well in the first conductivity type substrate and comprising the first conductivity type active region connected to the $V_{SS}$ line and the second conductivity type active region connected to the I/O pad.

In one embodiment, the power clamp element is arranged between the $V_{DD}$ ESD protection element and the $V_{SS}$ ESD protection element.

In one embodiment, the $V_{SS}$ ESD protection element and the power clamp element further comprise the second conductivity type well surrounding the second conductivity type active region.

In one embodiment, at least a portion of the I/O ESD protection cell is formed below the I/O pad.

In one embodiment, the I/O ESD protection cell is formed below the I/O pad.

In one embodiment, the first conductivity type active region of the $V_{DD}$ ESD protection element is divided into at least two regions, each of the regions being connected to the I/O pad, and the second conductivity type active region is separated from the first conductivity type active region divided into at least two regions and surrounds the first conductivity type active region in a closed-loop form to form at least two diodes connected in parallel.

In one embodiment, the second conductivity type active region of the $V_{DD}$ ESD protection element is divided into at least two regions, each of the regions being connected to the I/O pad, and the first conductivity type active region is separated from the second conductivity type active region divided into at least two regions and surrounds the second conductivity type active region in a closed-loop form to form at least two diodes connected in parallel.

In one embodiment, the first conductivity type active region of the power clamp element is separated from the second conductivity type active region and surrounds the second conductivity type active region in a closed-loop form.

In one embodiment, the power clamp element and the $V_{SS}$ ESD protection element share a portion of the first conductivity type active region.

According to further another aspect of the present invention, there is provided an integrated circuit device having an I/O ESD protection cell. Herein, the I/O ESD protection cell comprises a power supply voltage ($V_{DD}$) ESD protection element comprising first conductivity type active regions and a first gate, wherein the first conductivity type active regions are formed within a second conductivity type well in a first conductivity type substrate and separated from one another to define a first channel region, at least one of the first conductivity type active regions being connected to an I/O pad and the other being connected to a $V_{DD}$ line, and the first gate being formed on the first channel region; a power clamp element comprising second conductivity type active regions and a second gate, wherein the second conductivity type active regions are formed within a first conductivity type well in the first conductivity type substrate and separated from one another to define a second channel region, at least one of the second conductivity type active regions being connected to the $V_{DD}$ line and the other being connected to a $V_{SS}$ line, and the second gate being formed on the second channel region, or a power clamp element comprising the first conductivity type active regions and a second gate, wherein the first conductivity type active regions are formed within the second conductivity type well in the first conductivity type substrate and separated from one another to define the second channel region, at least one of the first conductivity type active regions being connected to the $V_{DD}$ line and the other being connected to the $V_{SS}$ line, and the second gate is formed on the second channel region; and a $V_{SS}$ ESD protection element comprising the second conductivity type active regions and a third gate, wherein the second conductivity type active regions are formed within the first conductivity type well in the first conductivity type substrate and separated from one another to define a third channel region, at least one of the second conductivity type active regions being connected to an I/O pad and the other being connected to the $V_{SS}$ line, and the third gate is formed on the third channel region.

In one embodiment, the elements are MOS transistors or field transistors.

In one embodiment, the power clamp element is arranged between the $V_{DD}$ ESD protection element and the $V_{SS}$ ESD protection element.

In one embodiment, at least a portion of the I/O ESD protection cell is formed below the I/O pad.

In one embodiment, the I/O ESD protection cell is formed below the I/O pad.

In one embodiment, the $V_{DD}$ ESD protection element further comprises the second conductivity type active region separated from all of the first conductivity type active regions, formed to surround all of the first conductivity type active regions in a closed-loop form, and connected to the $V_{DD}$ line.

In one embodiment, the $V_{SS}$ ESD protection element further comprises the first conductivity type active region separated from all of the second conductivity type active regions, formed to surround all of the second conductivity type active regions in a closed-loop form, and connected to the $V_{SS}$ line.

In one embodiment, the first conductivity type active region of the $V_{DD}$ ESD protection element is divided into at least three regions, where the central region is connected to the I/O pad and the other are connected to the $V_{DD}$ line to form at least two transistors connected in parallel.

In one embodiment, the second conductivity type active region of the $V_{SS}$ ESD protection element is divided into at least three regions, where the central region is connected to the I/O pad and the other are connected to the $V_{DD}$ line to form at least two transistors connected in parallel.

In one embodiment, the first gate is connected to the $V_{DD}$ line, the second gate formed on the second channel region defined by the second conductivity type active regions is connected to the $V_{SS}$ line, the second gate formed on the second channel region defined by the first conductivity type active regions is connected to the $V_{DD}$ line, and the third gate is connected to the $V_{SS}$ line.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF THE INVENTION

An integrated circuit device according to the present invention includes an I/O ESD protection cell comprising a $V_{SS}$ ESD protection element and a $V_{DD}$ ESD protection element, which are directly connected to an I/O pad, and a power clamp element, which connects a $V_{SS}$ line and a $V_{DD}$ line to each other. Each of the ESD protection elements connected to the I/O pad is formed in a small area, but the presence of the power clamp element in the I/O ESD protection cell leads to formation of a current shunt path for bypassing an electrostatic current. Accordingly, the I/O ESD protection cell operates as if ESD protection elements with very large areas are connected to the I/O pad. In addition, a plurality of power clamp elements equipped into each of I/O ESP protection cells are connected in parallel. Thus, if ESD is applied to a certain I/O pad, the plurality of power clamp elements equipped into each of I/O ESD protection cells are turned on in parallel so that a very large amount of ESD current can be handled by means of the power clamp elements. Accordingly, it is possible to efficiently use areas of the integrated circuit device and achieve a stable ESD protection function. Further, since the I/O ESD protection cell is provided below the I/O pad in another embodiment of the present invention, the size of an integrated circuit device will be minimized.

Examples of integrated circuit devices employing the I/O ESD protection cell according to the present invention include minute electronic devices, such as highly integrated semiconductor memory devices, processors, micro-electro-mechanical systems (MEMS), or optoelectronic devices. In particular, the I/O ESD protection cell can be efficiently employed in a device which has a very narrow pad pitch and a small area for forming an ESD protection element, such as an LCD Driver IC (LDI).

Figure 2:
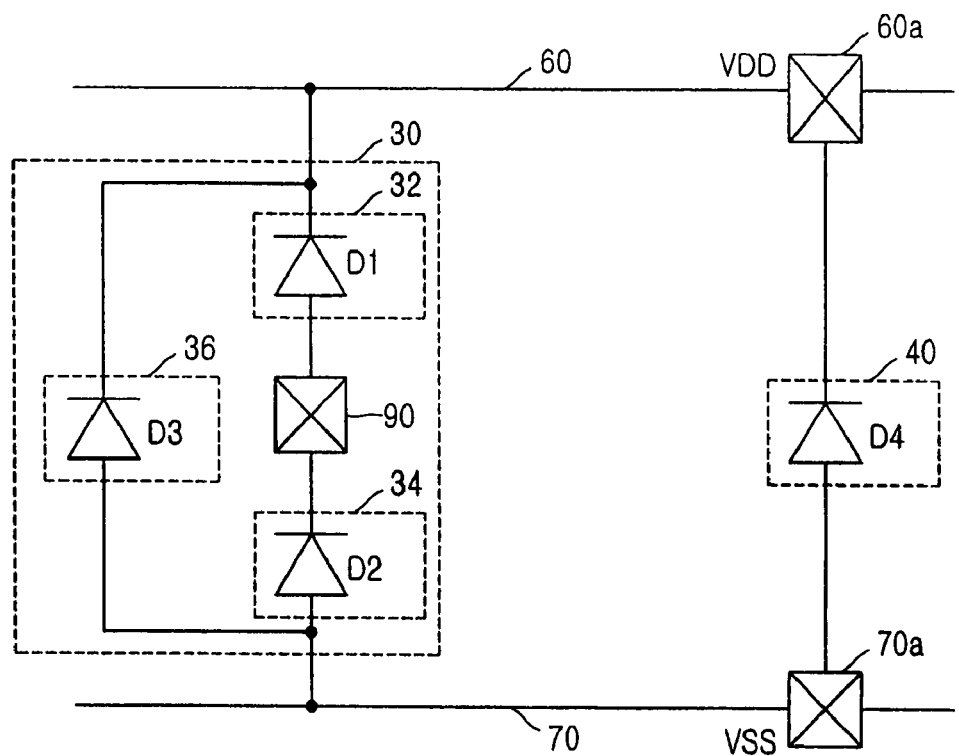
FIG. 2 is a circuit diagram showing an integrated circuit device having an I/O ESD protection cell according to the present invention.

FIG. 2 is a circuit diagram showing an integrated circuit device having an I/O ESD protection cell according to the present invention.

The integrated circuit device comprises a $V_{DD}$ line 60 connected to a $V_{DD}$ pad 60a and a $V_{SS}$ line 70 connected to a $V_{SS}$ pad 70a. An I/O ESD protection cell 30 comprises a $V_{DD}$ ESD protection element 32, a $V_{SS}$ ESD protection element 34, and a power clamp element 36, where the $V_{DD}$ ESD protection element 32 is connected between the $V_{DD}$ line 60 and an I/O pad 90, the $V_{SS}$ ESD protection element 34 is connected between the $V_{SS}$ line 70 and the I/O pad 90, and the power clamp element 36 is connected between the $V_{DD}$ line 60 and the $V_{SS}$ line 70. A power clamp element 40, which provides a path for conducting an electrostatic current, is connected between the $V_{DD}$ pad 60a and the $V_{SS}$ pad 70a.

While diodes D1, D2, D3, and D4 have been illustrated as the ESD protection elements 32 and 34 and the power clamp elements 36 and 40, metal oxide semiconductor (MOS) transistors, field oxide transistors, bipolar transistors, or thyristors may be used.

Figure 1:
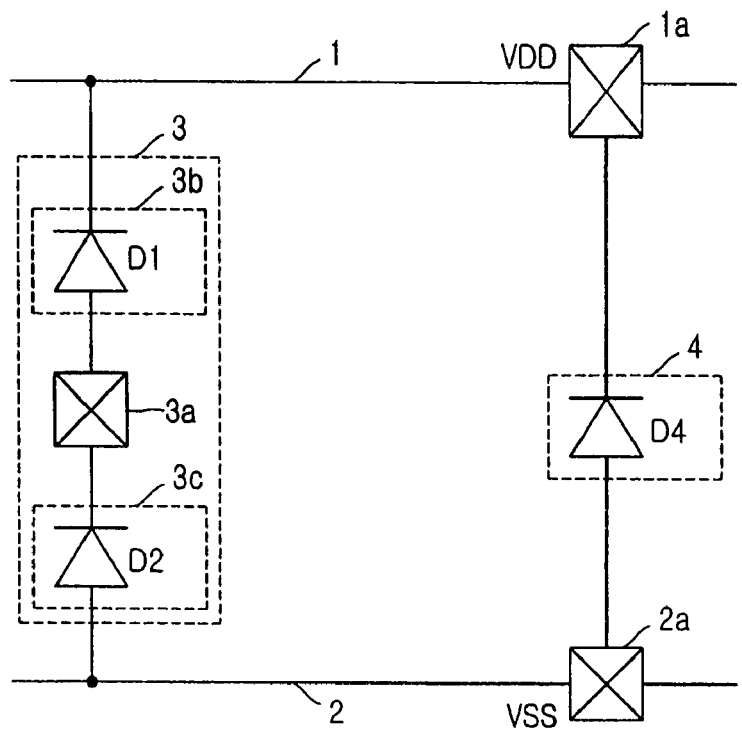
FIG. 1 is a circuit diagram showing an ESD protection circuit used in a conventional integrated circuit device.

FIGS. 3A-3D are circuit diagrams showing current paths for bypassing the ESD current in integrated circuit devices according to the present invention shown in FIG. 2 and the prior art shown in FIG. 1.

Figure 3A:
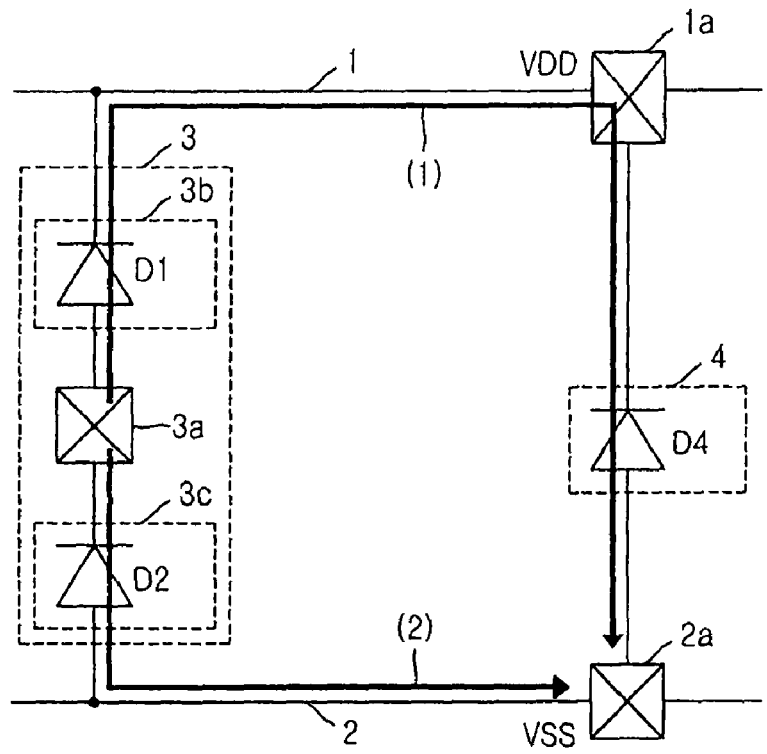
FIGS. 3A-3D are circuit diagrams showing current paths for bypassing the ESD current in integrated circuit devices according to the present invention and the prior art.
Figure 3B:
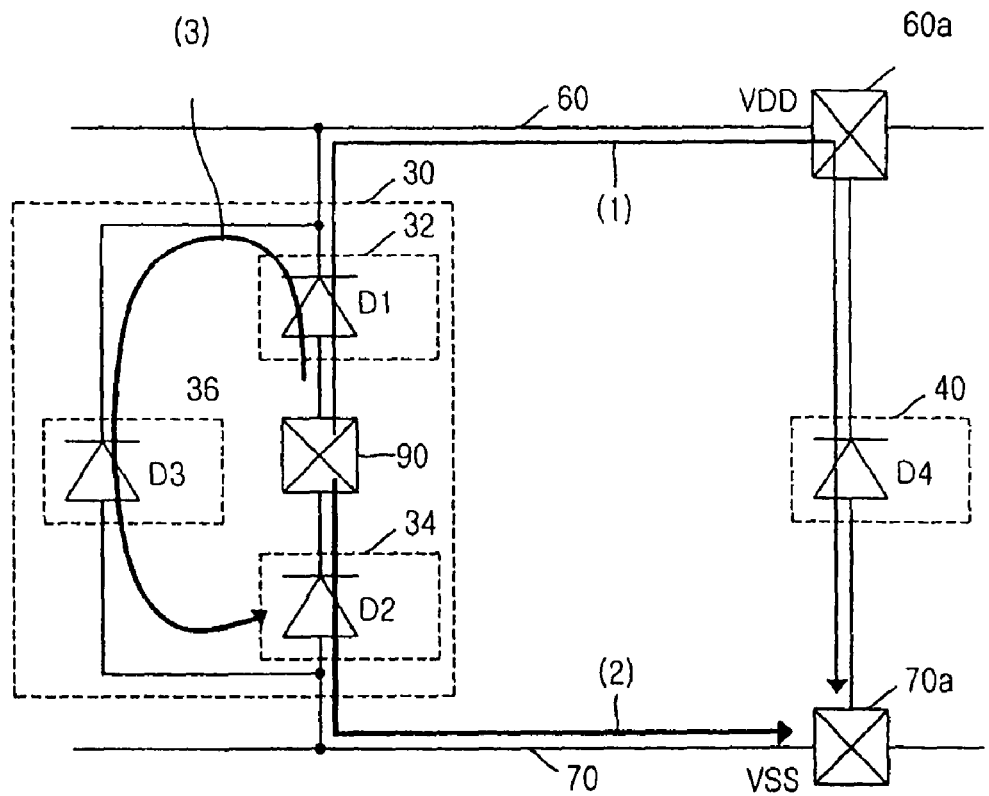
Figure 3C:
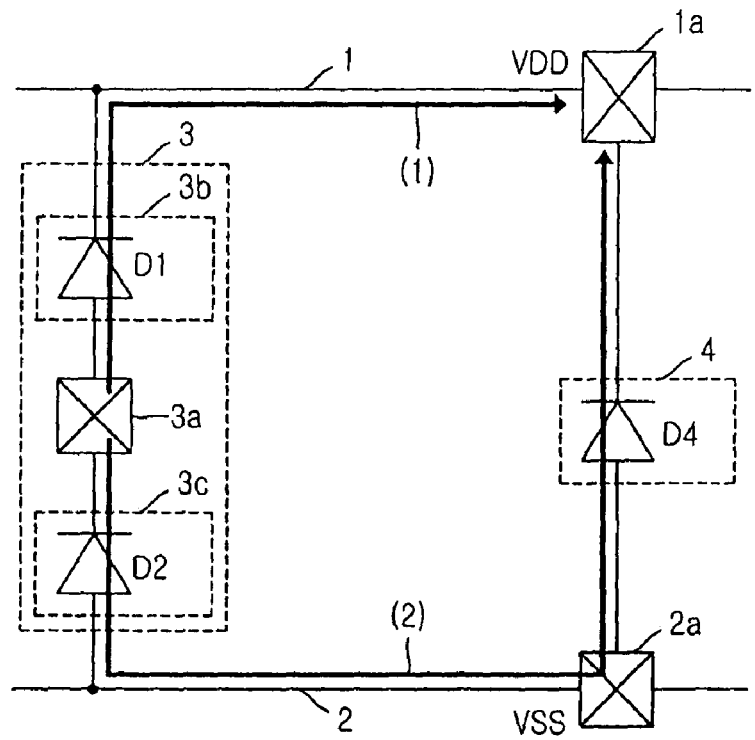
Figure 3D:
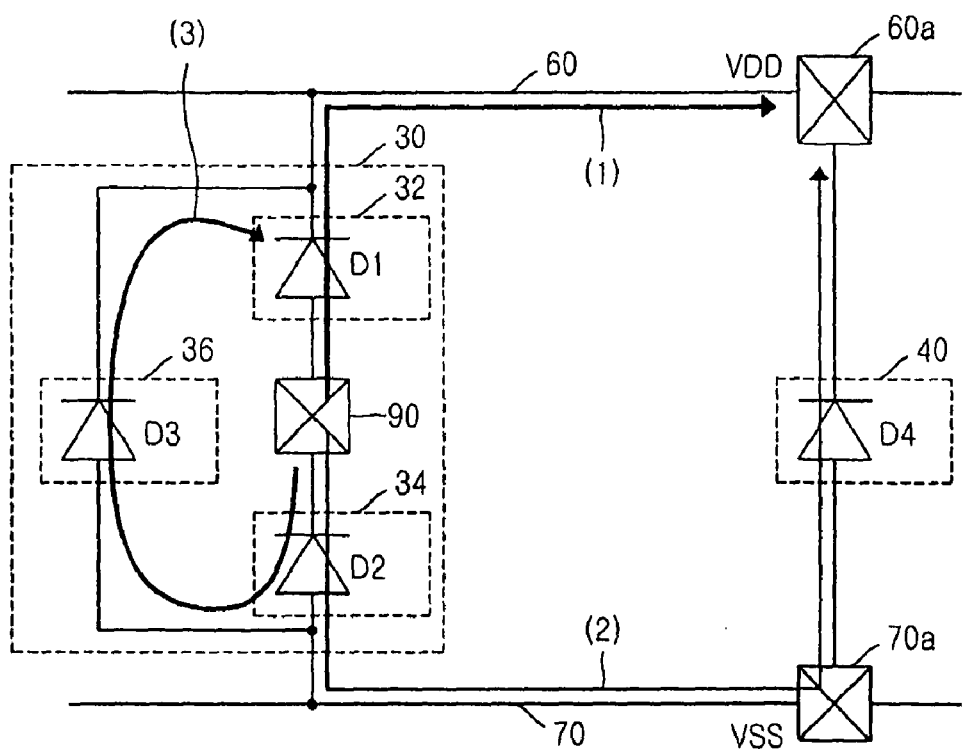

In FIGS. 3A-3D, there is applied a reverse bias which has an effect on diode characteristics. FIGS. 3A and 3B show a case where a positive ESD event is applied with $V_{DD}$ floating but $V_{SS}$ grounded. FIGS. 3C and 3D show a case where a negative ESD event is applied with $V_{DD}$ grounded but $V_{SS}$ floating.

Referring to FIG. 3A, an electrostatic current bypasses along a path (1) and a path (2) in a conventional integrated circuit device. The path (1) is formed through a forward biased diode D1 and a reverse biased diode D4, when a breakdown caused by exceeding a reverse breakdown voltage occurs in the diode D4. The path (2) is formed through a reverse biased diode D2, when a breakdown caused by exceeding a reverse breakdown voltage occurs in the diode D2. Meanwhile, in an integrated circuit device according to the present invention as shown in FIG. 3B, in addition to the two paths (1) and (2), a new path (3) is formed through a forward biased diode D1 and a power clamp element D3, when a breakdown caused by exceeding a reverse breakdown voltage occurs in the diode D3. The path (3) is more significant in electrostatic discharge than the path (1).

Referring to FIG. 3C, two paths (1) and (2) contribute to electrostatic discharge in a conventional integrated circuit device. Meanwhile, in the ESD protection circuit according to the present invention as shown in FIG. 3D, in addition to the two paths (1) and (2), a path (3) is formed through a power clamp element D3. The path (3) is more significant for electrostatic discharge than the path (2).

In an integrated circuit device according to the present invention as shown in FIG. 3D, an ESD current path is formed via the power clamp element with which the I/O ESD protection cell is equipped. As a result, the I/O ESD protection cell operates as if an ESD protection element with a very large area is connected to an I/O pad. Accordingly, since the integrated circuit device according to the present invention further includes the power clamp elements corresponding to the number of I/O pads in addition to the power clamps corresponding to the number of power pads, it is possible to handle a very large ESD current even though elements constituting the I/O ESD protection cell are small in size.

Exemplary embodiments of an integrated circuit device equipped with the circuit shown in FIG. 2 are now set forth.

Figure 4A:
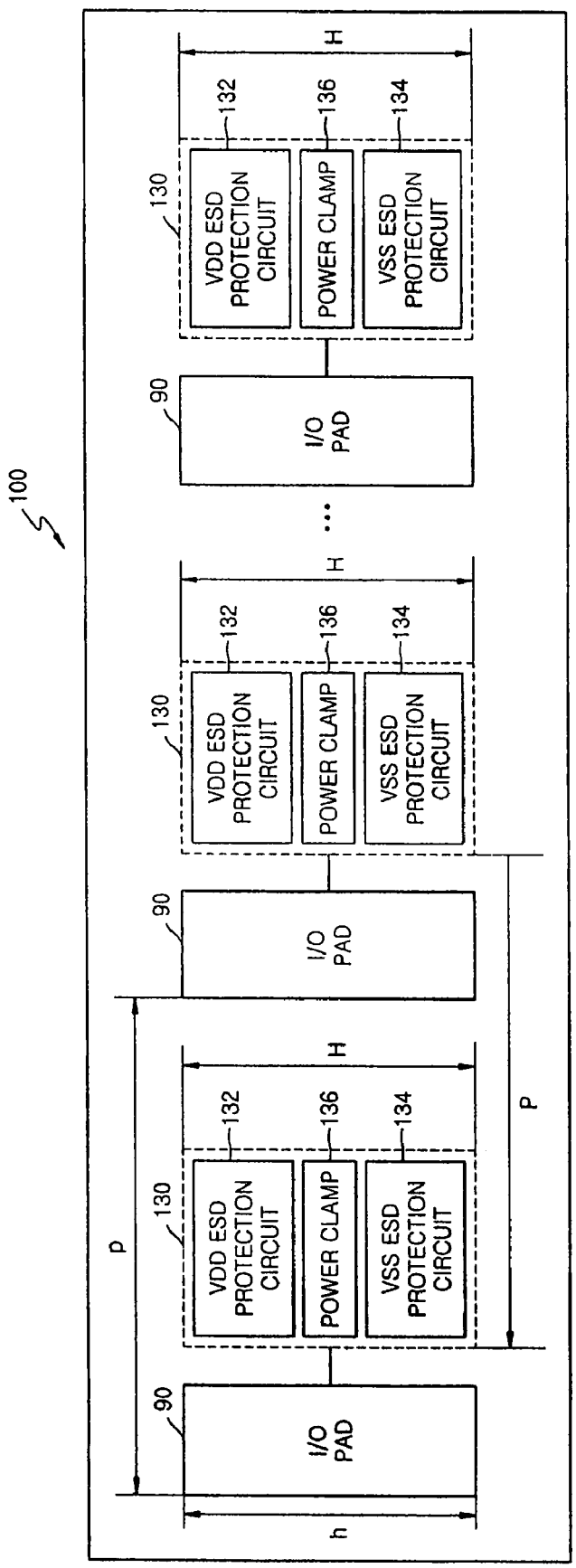
FIG. 4A is a schematic diagram showing an integrated circuit device according to a first embodiment of the present invention.
Figure 4B:
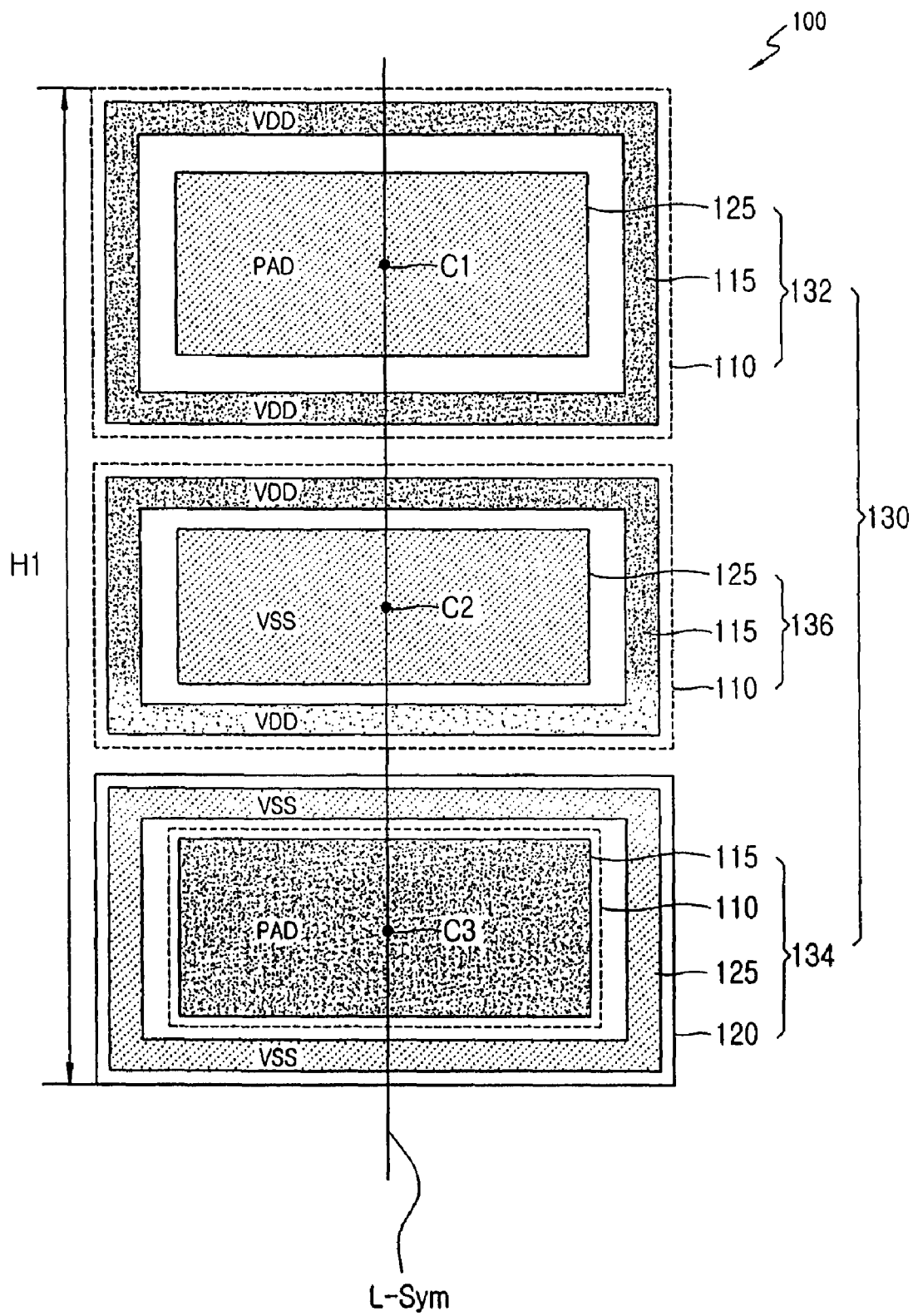
FIGS. 4B and 4C show layouts of an I/O ESD protection cell.
Figure 4C:
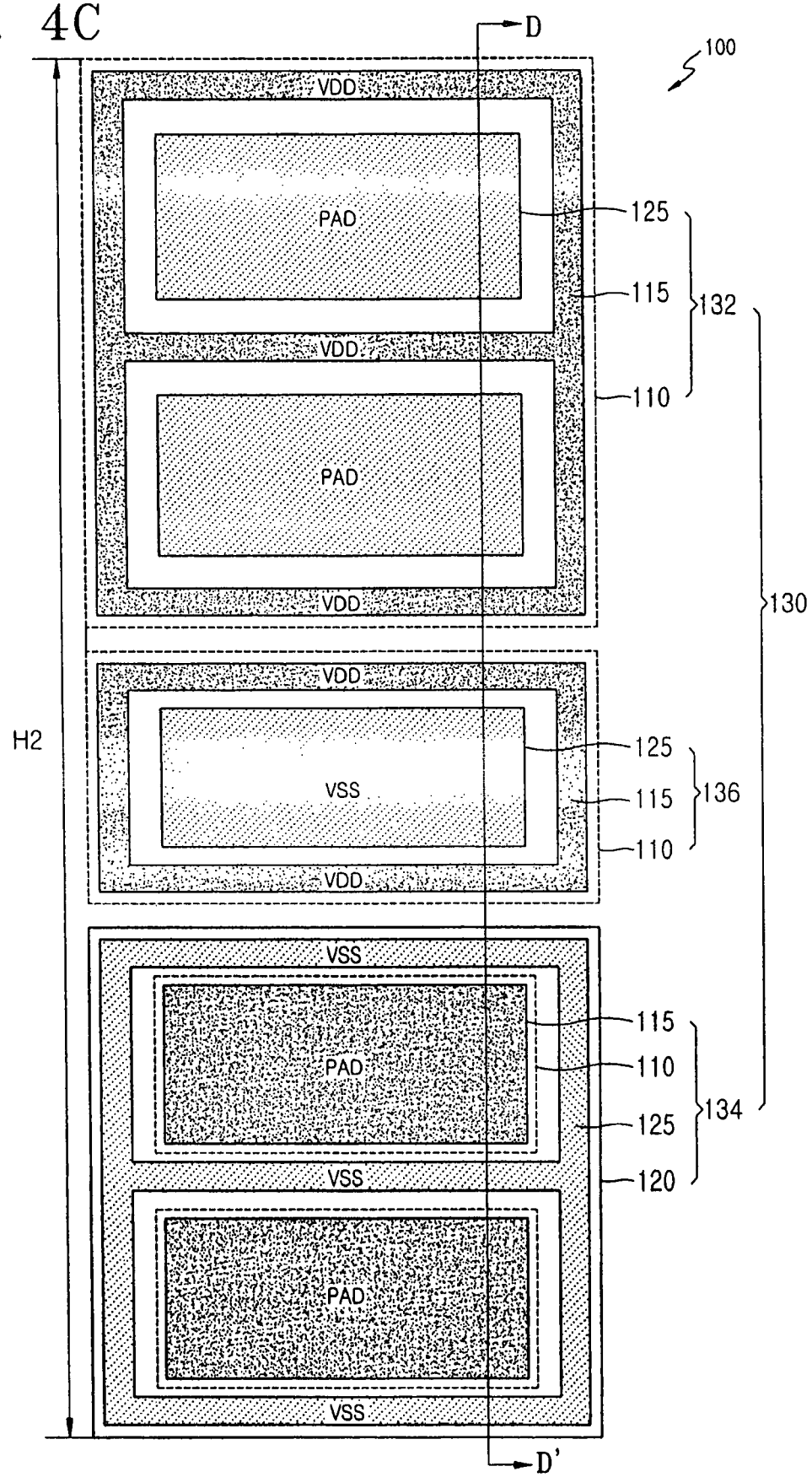
Figure 4D:
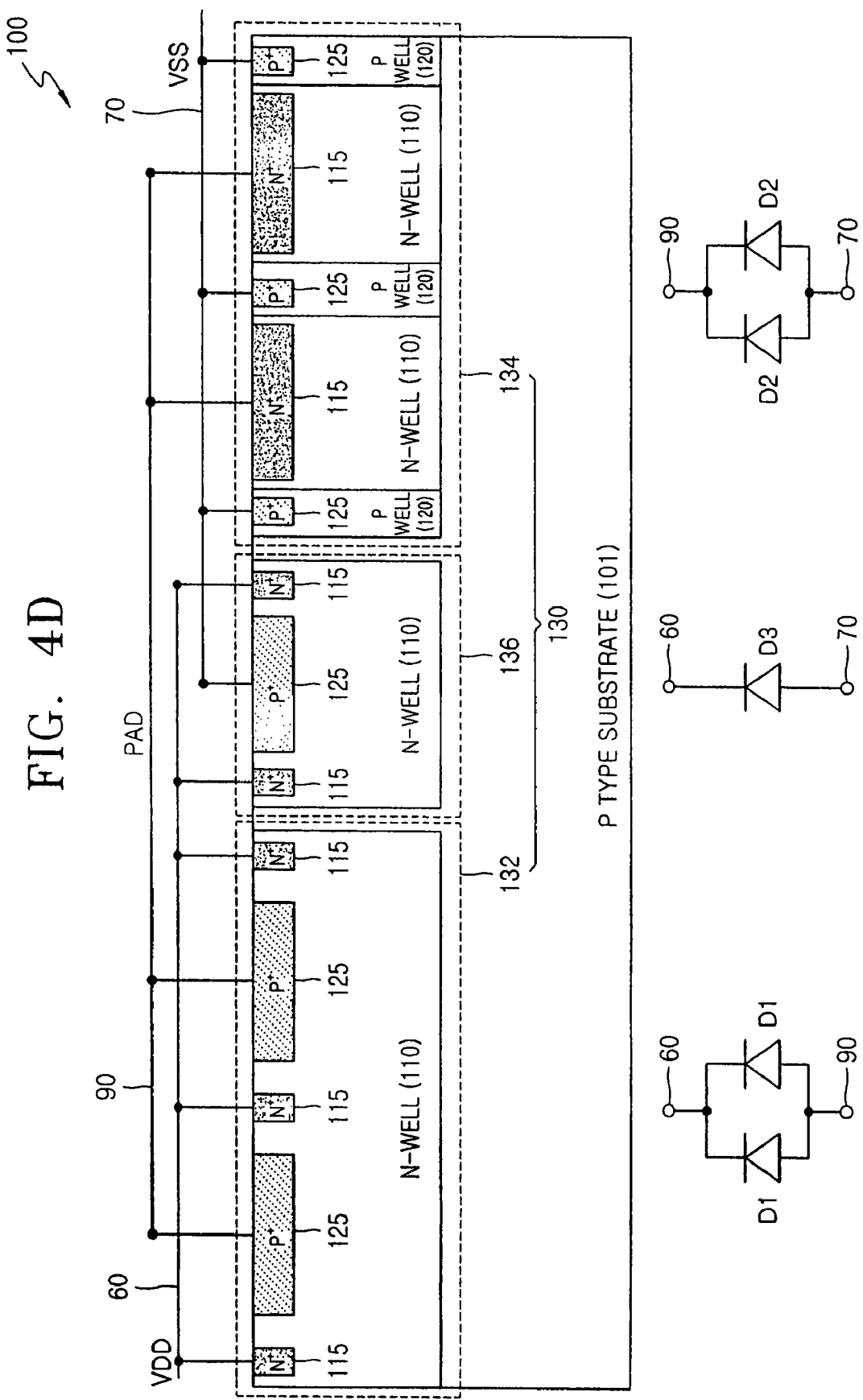
FIG. 4D is a sectional view taken along the D-D' line of FIG. 4C.

FIG. 4A is a schematic diagram showing an integrated circuit device 100 according to a first embodiment of the present invention. FIGS. 4B and 4C show layouts of an I/O ESD protection cell 130. FIG. 4D is a sectional view taken along the D-D' line of FIG. 4C.

The integrated circuit device 100 comprises the I/O ESD protection cell 130 for each I/O pad 90. The ESD protection cell 130 may be located beside the I/O pad 90, or at least a portion or all of the ESD protection cell 130 may be located below the I/O pad 90, which will be described later. The pitch P and height H of the I/O ESD protection cell 130 are determined depending on the pitch p and height h of the I/O pad 90.

In FIGS. 4B and 4C, the pitches of the I/O ESD protection cells 130 are the same, but the heights are different from each other. When the height H1 is small, as shown in FIG. 4B, the area of the I/O ESD protection cell 130 should be made smaller. However, when the height H2 is large, as shown in FIG. 4C, the area of the I/O ESD cell 130 is enlarged and the ESD protection function can be thus improved.

In the I/O ESD protection cell 130, a $V_{DD}$ ESD protection element 132, a power clamp element 136, and a $V_{SS}$ ESD protection element 134 are arranged adjacent to each other so that central points C1, C2, and C3 of these elements are located on a straight line and these elements occupy minimum areas. Further, these elements are symmetrically arranged with respect to the line L-Sym connecting the central points C1, C2, and C3 of these elements.

Referring to FIGS. 4C and 4D, in the I/O ESD protection cell 130 according to a first embodiment, the power clamp element 136 is separated from the $V_{DD}$ ESD protection element 132 and the $V_{SS}$ ESD protection element 134, whereby an effect of a parasitic ESD current path can be prevented. In addition, the power clamp element 136 is arranged between the $V_{DD}$ ESD protection element 132 and the $V_{SS}$ ESD protection element 134, whereby an efficient arrangement of the $V_{DD}$ line 60 and the $V_{SS}$ line 70 is possible.

In addition, as shown in circuit diagrams of FIG. 4D, when each of the $V_{DD}$ ESD protection element 132 and the $V_{SS}$ ESD protection element 134 is comprised of two diodes connected in parallel to each other, the ESD current path is divided and the ESD protection function is thus improved. While the drawings illustrate a case where two diodes are connected to each other in parallel, if possible, more than two diodes are preferably connected to one another in parallel.

The protection elements 132 and 134 and the power clamp element 136 are formed in a P-well 120 doped with first conductive impurities and an N-well 110 doped with second conductive impurities, which are independently formed on a first conductivity type substrate, e.g., a P-type substrate 101.

The $V_{DD}$ ESD protection element 132 is a diode comprising an N-well 110, an N+ active region 115, and a P+ active region 125. The N+ active region 115 and the P+ active region 125 are separated from each other in the N-well 110. The N+ active region 115 is formed to surround the P+ active region 125 in a closed-loop form. The P+ active region 125 is connected to the I/O pad 90 to form an anode of a diode D1, and the N+ active region 115 is connected to the $V_{DD}$ line 60 to form a cathode of the diode D1 together with the N-well 110.

The $V_{SS}$ ESD protection element 134 is a diode comprising the N-well 110 and the N+ active region 115, and the P-well 120 and the P+ active region 125. The P+ active region 125 is separated from the N+ active region 115 and is formed to surround the N+ active region 115 in a closed-loop form. The P+ active region 125 is connected to the $V_{SS}$ line 70 to form an anode of a diode D2 together with the P-well 120, and the N+ active region 115 is connected to the I/O pad 90 to form a cathode of the diode D2 together with the N-well 110. The N-well 110 surrounds the N+ active region 115, and thus the ESD protection function is improved.

While the P-well 120 and the N-well 110 have the same depths in FIG. 4D, the N-well 110 may be formed in the P-well 120 to be completely surrounded by the P-well 120. Otherwise, the P-well 120 may be formed in the N-well 110 to be completely surrounded by the N-well 110.

The power clamp element 136 is a diode comprising the N-well 110, the N+ active region 115, and the P+ active region 125. The N+ active region 115 and the P+ active region 125 are separated from each other in the N-well 110. The N+ active region 115 is formed to surround the P+ active region 125 in a closed-loop form. The P+ active region 125 is connected to the $V_{SS}$ line 70 to form an anode of a diode D3, and the N+ active region 115 is connected to the $V_{DD}$ line 60 to form a cathode of the diode D3 together with the N-well 110.

The N-well 110 surrounds the N+ active region 115 and diode characteristics are thus improved. In addition, since the area of the N+ active region 115 can be sufficiently secured, the function of the power clamp element 136 can be increased.

Figure 5A:
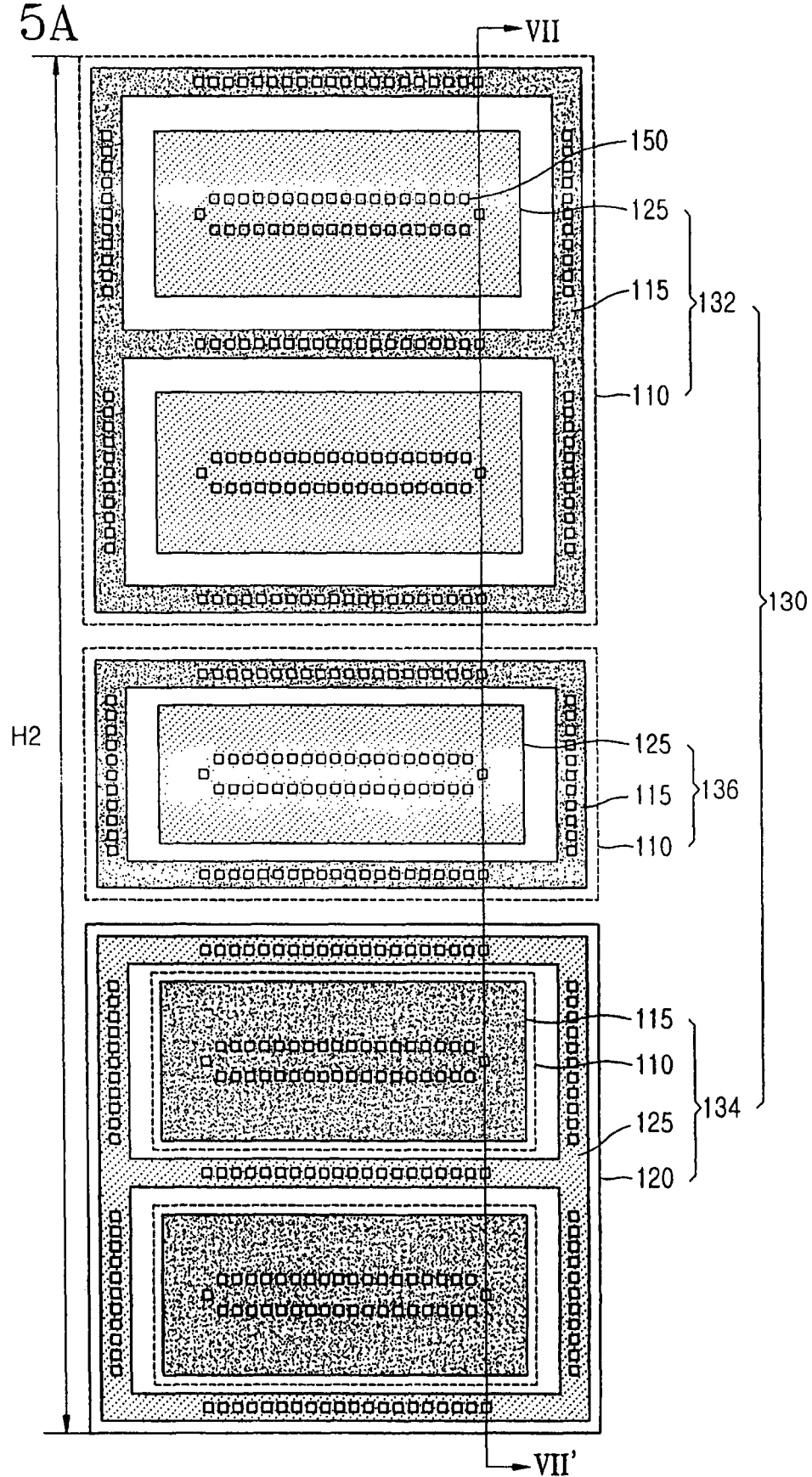
FIGS. 5A through 5D show layouts used for forming wirings and an I/O pad, which are connected to elements constituting the I/O ESD protection cell, according to a first embodiment of the present invention.
Figure 5B:
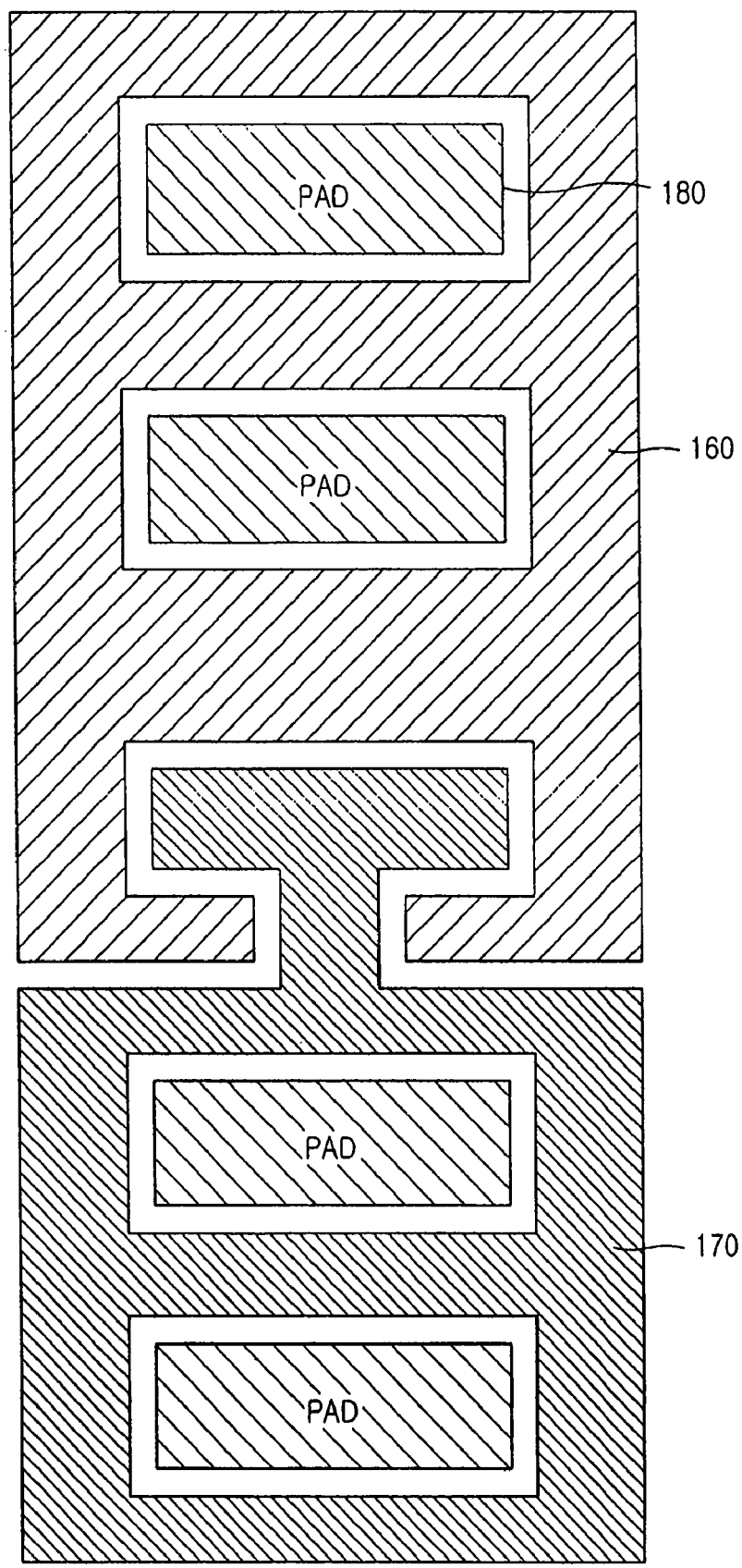
Figure 5C:
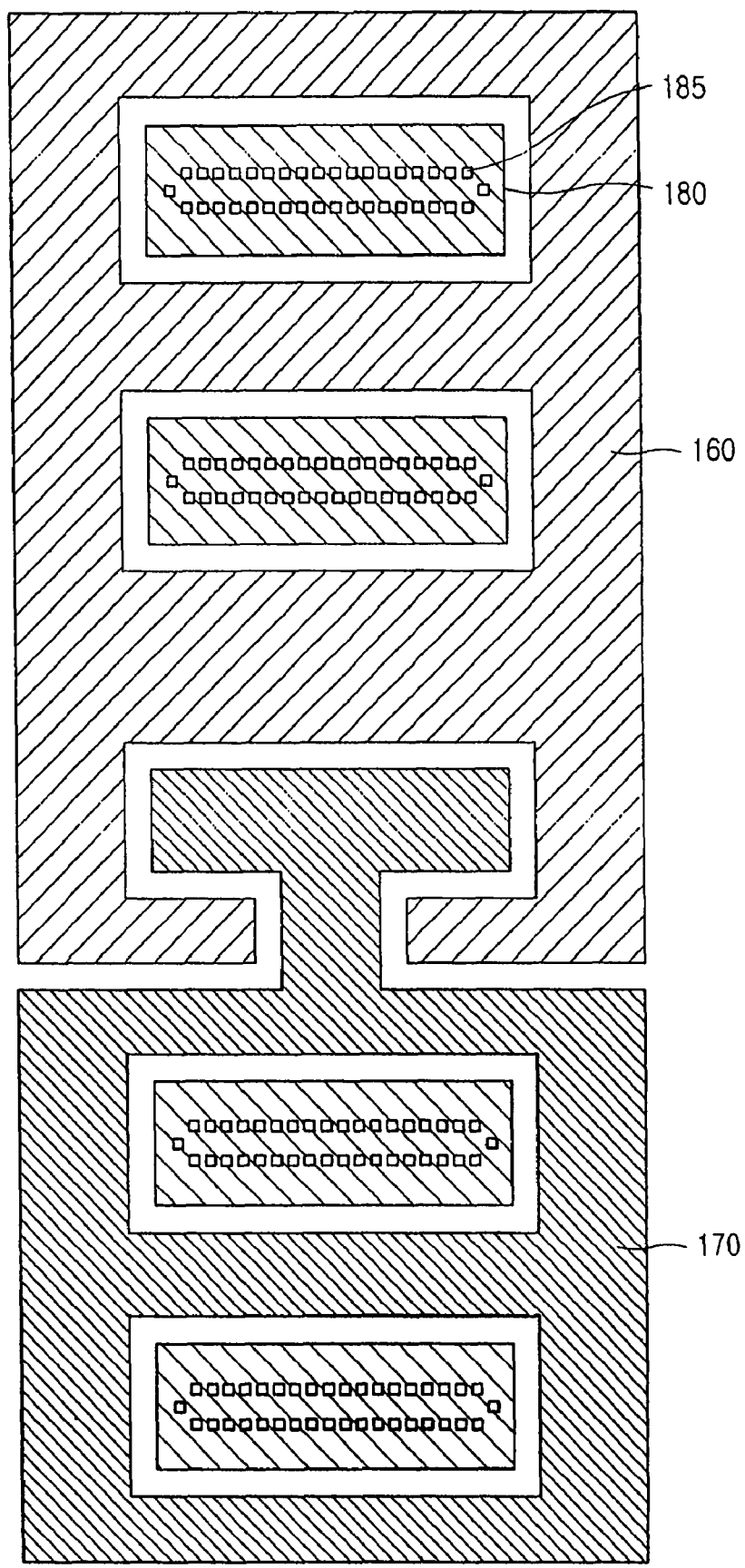
Figure 5D:
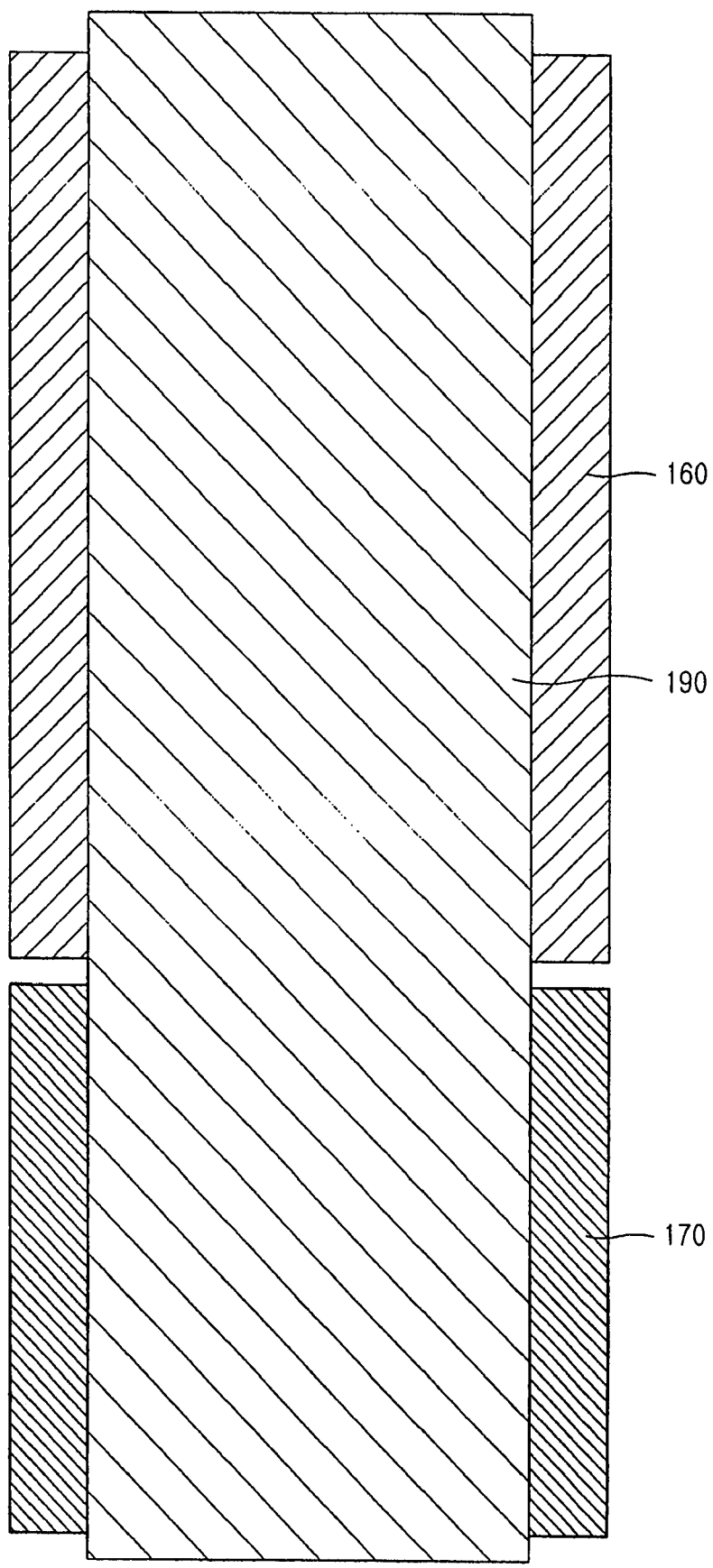

FIGS. 5A through 5D show layouts used for forming $V_{DD}$ and $V_{SS}$ lines 160 and 170 and an I/O pad 190, which are connected to elements constituting the I/O ESD protection cell 130. FIG. 5A shows a layout for forming a contact hole 150 exposing the active regions 115 and 125. FIG. 5B shows a layout for forming an intermediate pad 180 to be connected to the $V_{DD}$ line 160, the $V_{SS}$ line 170, and the I/O pad. FIG. 5C shows a layout of a via 185 for connecting the I/O pad 190 to the intermediate pad 180. FIG. 5D shows a layout of the I/O pad 190.

Figure 6:
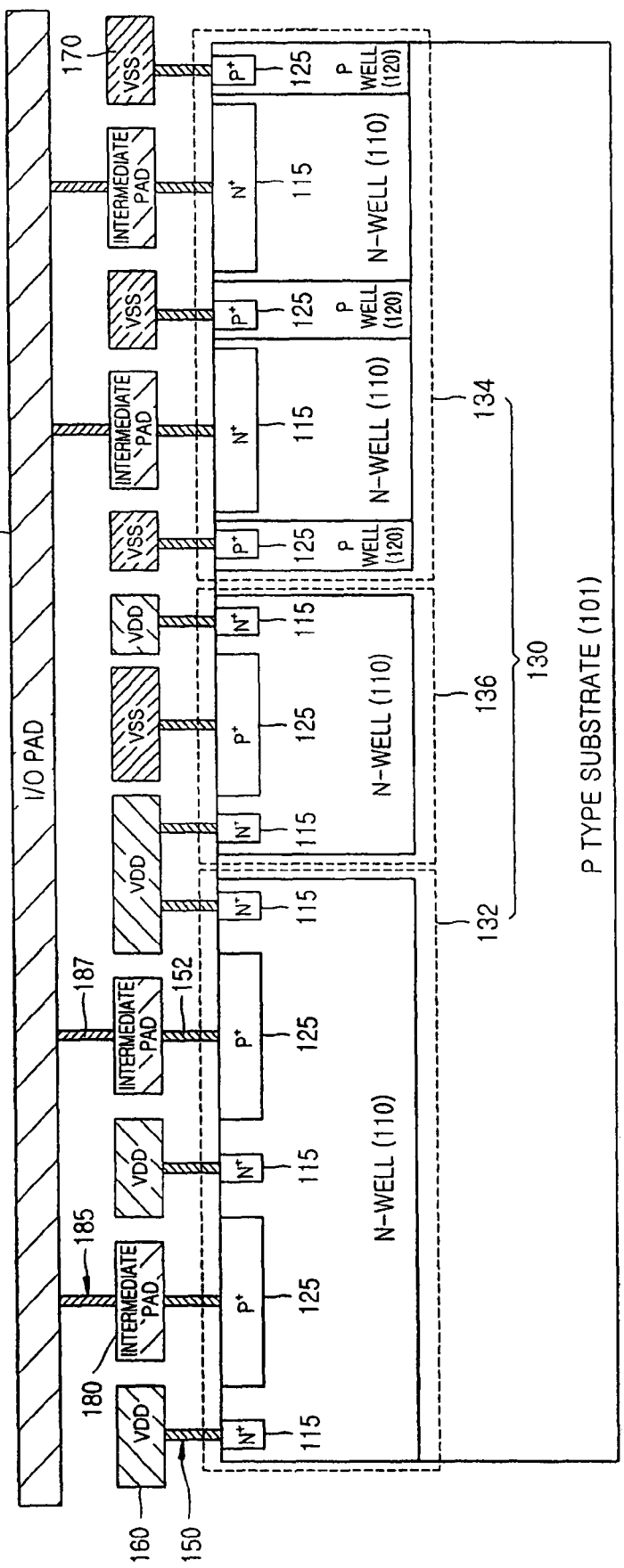
FIG. 6 is a sectional view showing an integrated circuit device completed using the layouts shown in FIGS. 5A through 5D.

FIG. 6 is a sectional view showing an integrated circuit device completed using the layouts shown in FIGS. 5A through 5D. Interlayer insulating films where contact holes and vias are formed are not shown.

Referring to FIG. 6, each of the active regions 115 and 125 is connected to the $V_{DD}$ line 160, the $V_{SS}$ line 170, and the intermediate pad 180 through a conductive plug 152 which fills the contact hole 150. The I/O pad 190 is connected to the intermediate pad 180 through a conductive plug 187 which fills a via 185. A PAD on ESD structure where the I/O ESD protection cell 130 is formed below the I/O pad 190 is very efficient in reducing the size of an integrated circuit device. When the size of an integrated circuit device decreases, the height of the I/O pad 190 is not changed or is increased to keep the characteristics of the I/O pad 190 unchanged although the pitch of the I/O pad 190 decreases. In this way, the area of the I/O ESD protection cell 130 can be as secure as possible.

Figure 7:
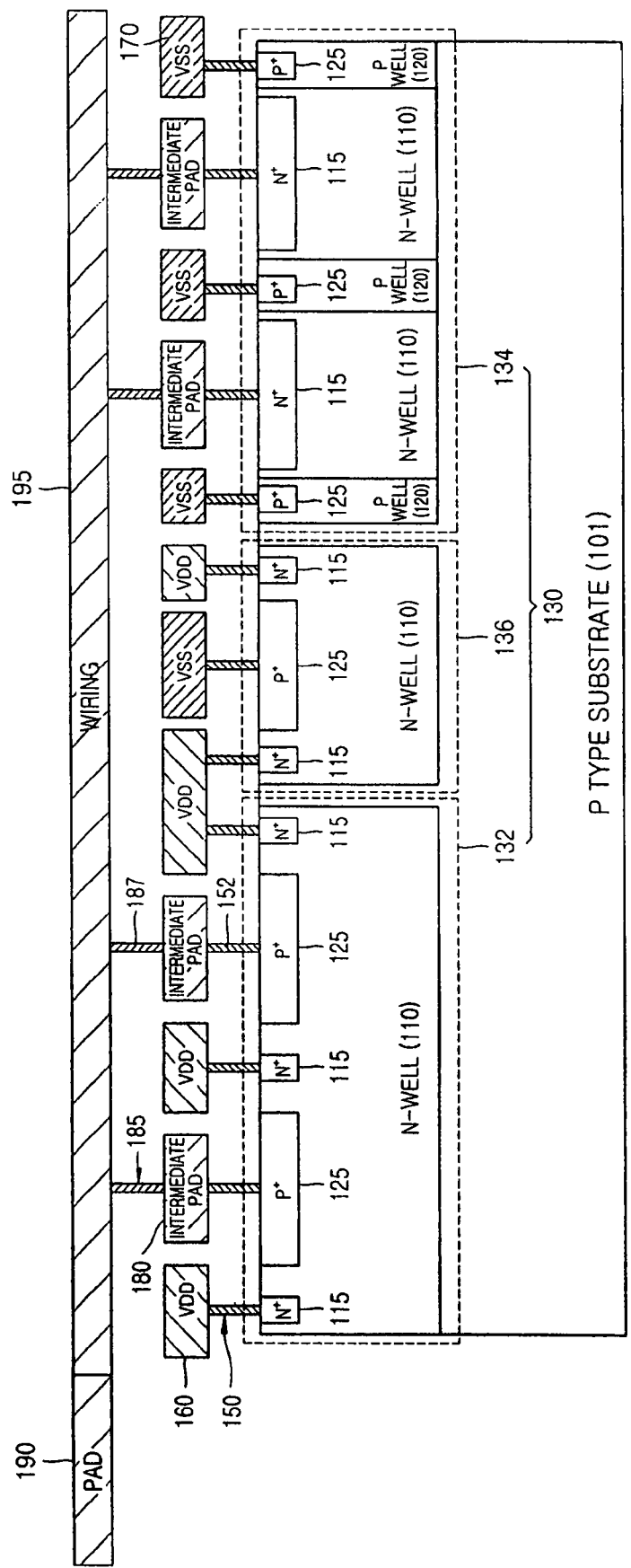
FIG. 7 is a sectional view of an integrated circuit device showing another connection relation with an I/O pad.

Meanwhile, at least a portion of the I/O ESD protection cell 130 may be located below the I/O pad 190. As shown in FIG. 7, if a sufficient area is secured for the I/O ESD protection cell 130, the I/O ESD protection cell 130 may be located beside the I/O pad 190, with the I/O pad 190 connected with the I/O ESD protection cell 130 by a wiring 195.

Figure 8:
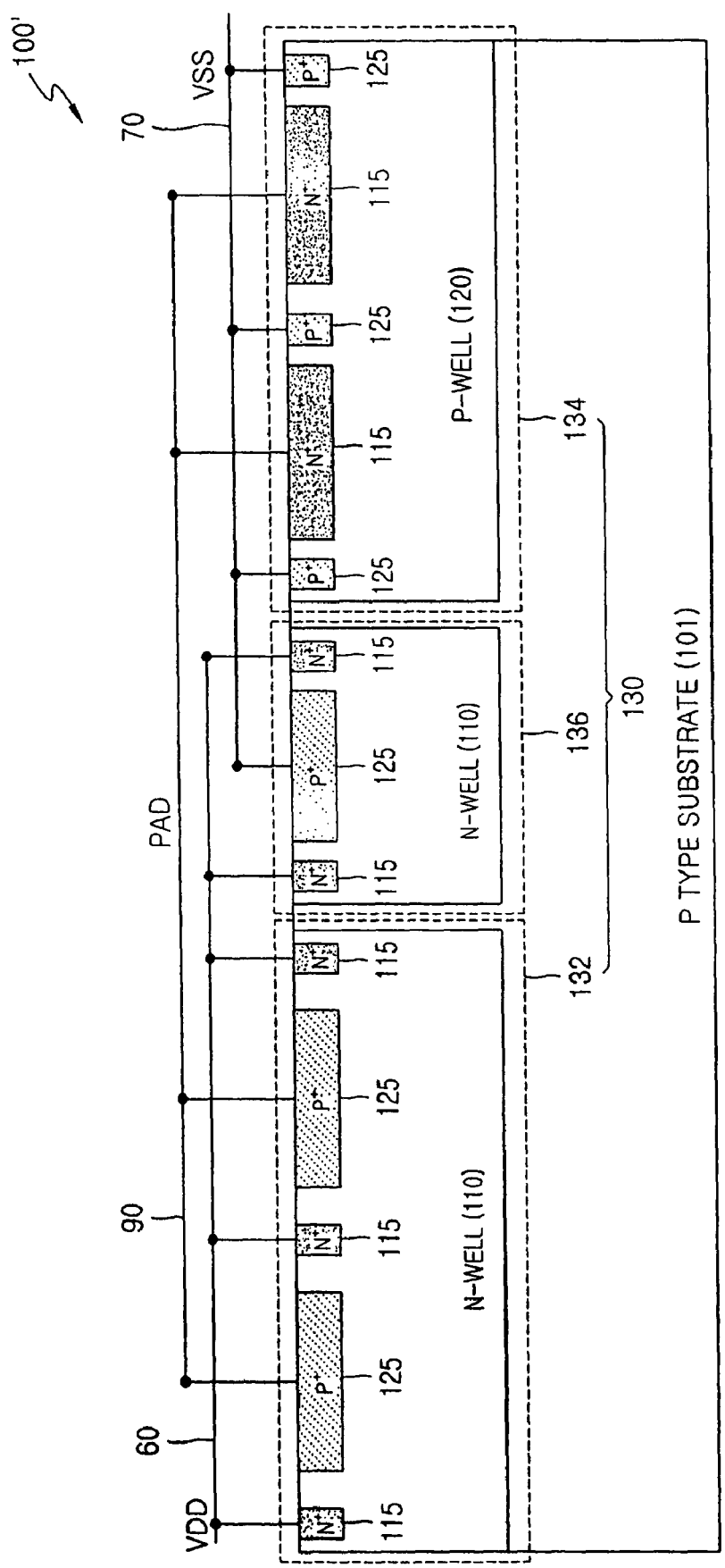
FIG. 8 is a sectional view showing a modified example of a first embodiment of the present invention.

FIG. 8 is a sectional view showing a modified example 100' of the first embodiment where the $V_{SS}$ ESD protection element 134 is formed in a P-well without an N-well. If a desired ESD protection function is achieved only by regulating process conditions for forming the $V_{SS}$ ESD protection element 134, as shown in FIG. 8, the N-well needs not to be formed.

Figure 9A:
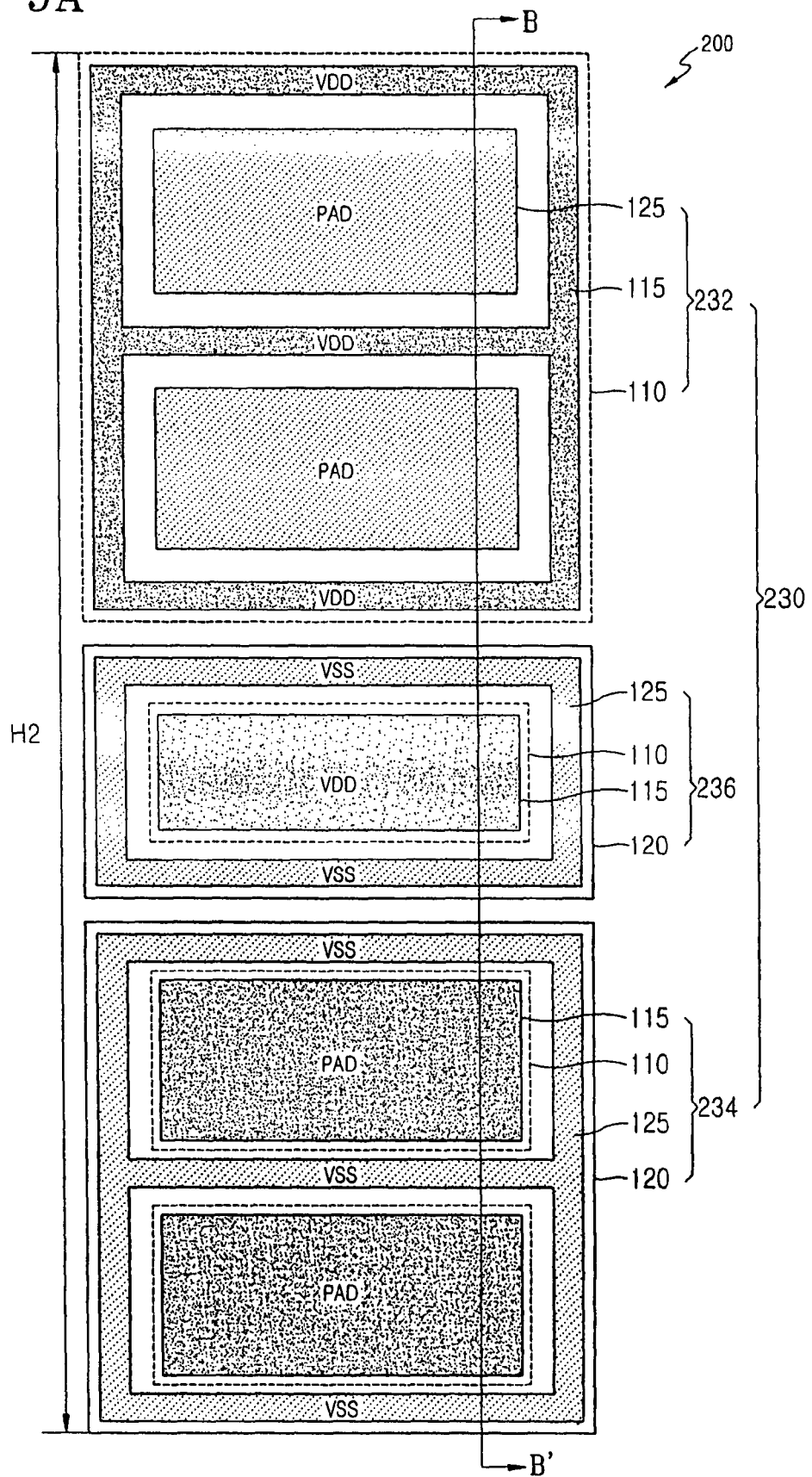
FIG. 9A shows a layout of an I/O ESD protection cell constituting an integrated circuit device according to a second embodiment of the present invention.
Figure 9B:
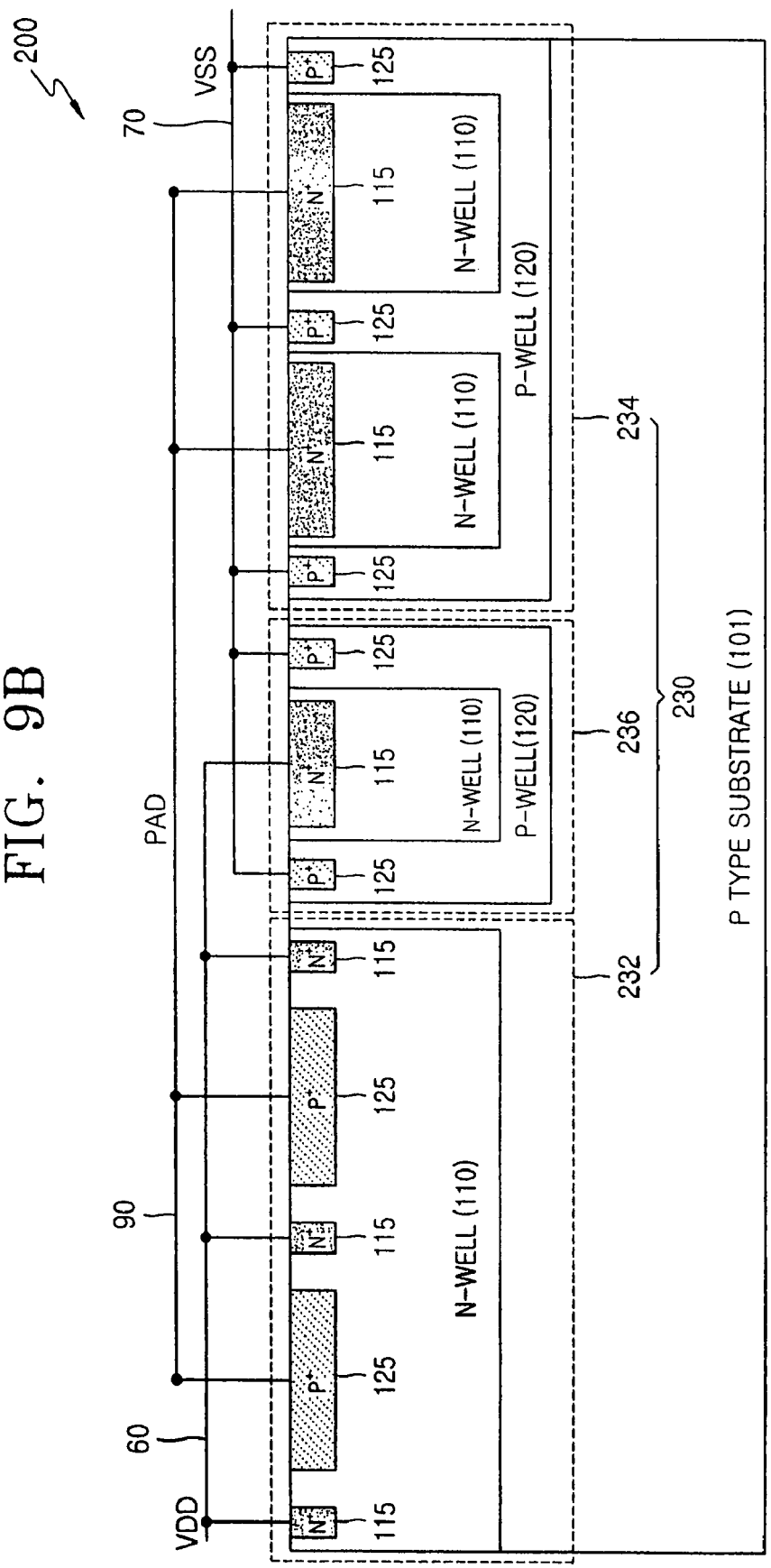
FIG. 9B is a sectional view taken along the B-B' line of FIG. 9A.
Figure 10:
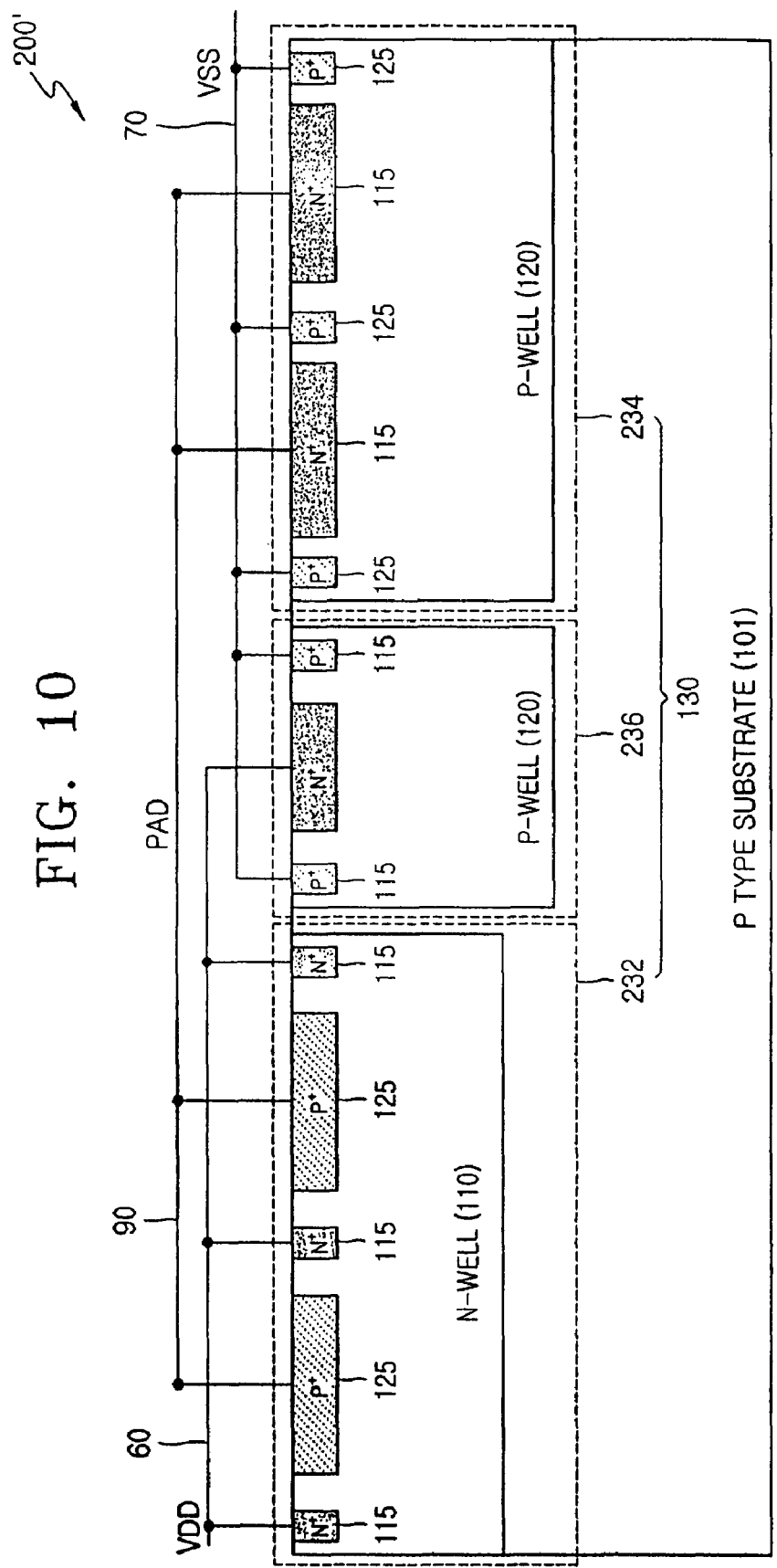
FIG. 10 is a sectional view showing a modified example of a second embodiment of the present invention.

FIG. 9A shows a layout of an I/O ESD protection cell 230 constituting an integrated circuit device 200 according to a second embodiment of the present invention. FIG. 9B is a sectional view taken along the B-B' line of FIG. 9A. FIG. 10 shows a modified embodiment of the second embodiment. The I/O ESD protection cell 230 of the second embodiment is different from that of the first embodiment in that a power clamp element 236 is a diode comprising a P-well 120 and an N-well 110 or an N+ active region 115, which is surrounded by the P-well 120.

Referring to FIGS. 9A and 9B, the power clamp element 236 is the diode comprising the P-well 120 and the N-well 110. The N+ active region 115 and a P+ active region 125 are separated a predetermined distance from each other. To improve ESD protection function, the N+ active region 115 is surrounded by the N-well 110, and the P+ active region 125 is formed in the P-well 120 that surrounds the N-well 110. The P+ active region 125 has a closed-loop form to surround the N+ active region 115. The P+ active region 125 is connected to the $V_{SS}$ line 70 to form an anode of a diode D3 together with the P-well 120, and the N+ active region 115 is connected to the $V_{DD}$ line 60 to form a cathode of the diode D3 together with the N-well 110.

In the second embodiment, the power clamp element 236 is separated from the protection elements 232 and 234, whereby an effect of a parasitic ESD current path can be prevented. In addition, the N-well 110 surrounds the N+ active region 115, whereby the efficiency of the power clamp element 236 increases.

FIG. 10 is a sectional view showing a modified example 200' of the second embodiment where a $V_{SS}$ ESD protection element 234 is formed in a P-well 120 without an N-well. If a desired ESD protection function is achieved only by regulating process conditions for forming the $V_{SS}$ ESD protection element 234, as shown in FIG. 10, the N-well does not need to be formed.

Figure 11A:
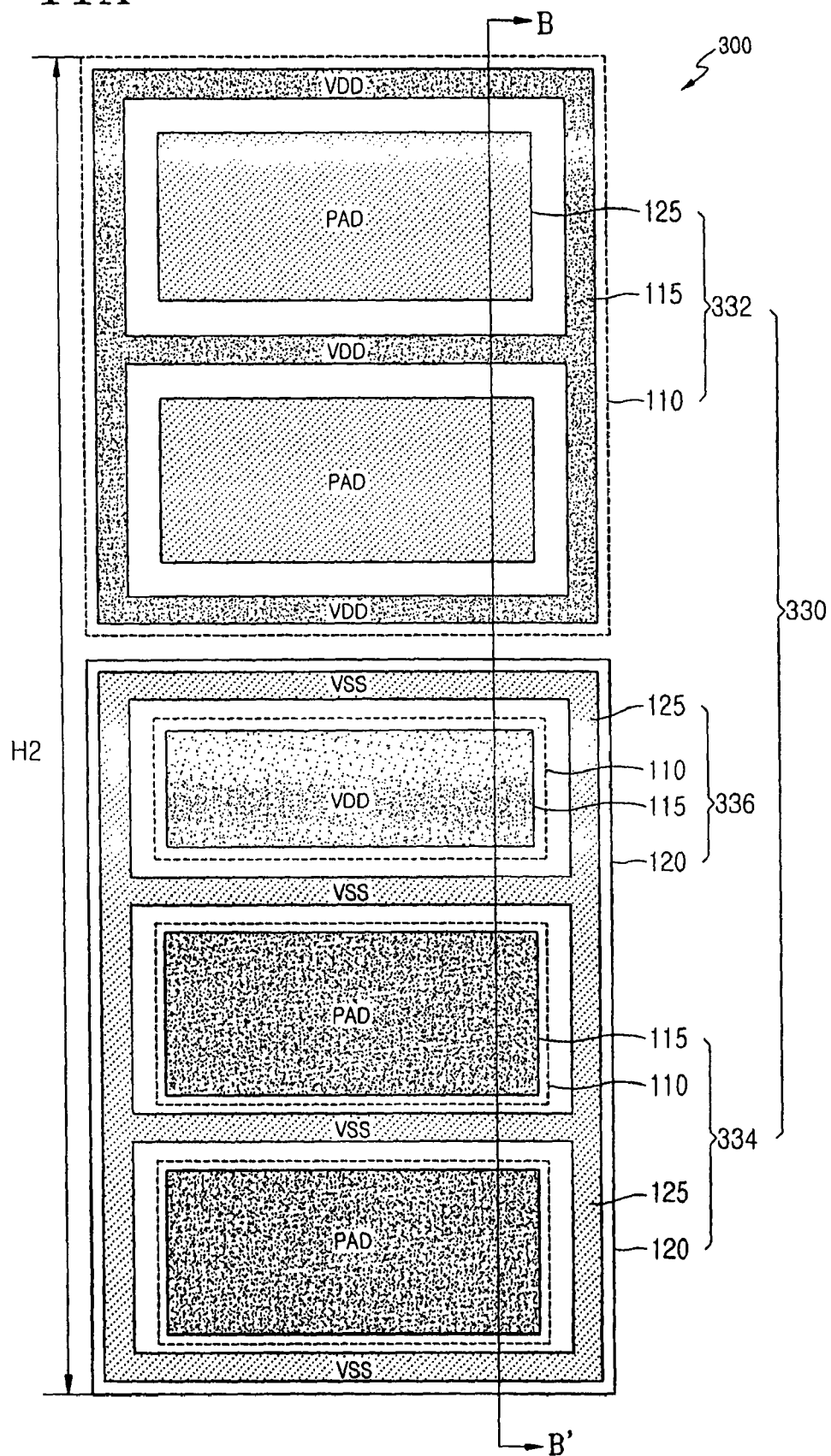
FIG. 11A shows a layout of an I/O ESD protection cell constituting an integrated circuit device according to a third embodiment of the present invention.
Figure 11B:
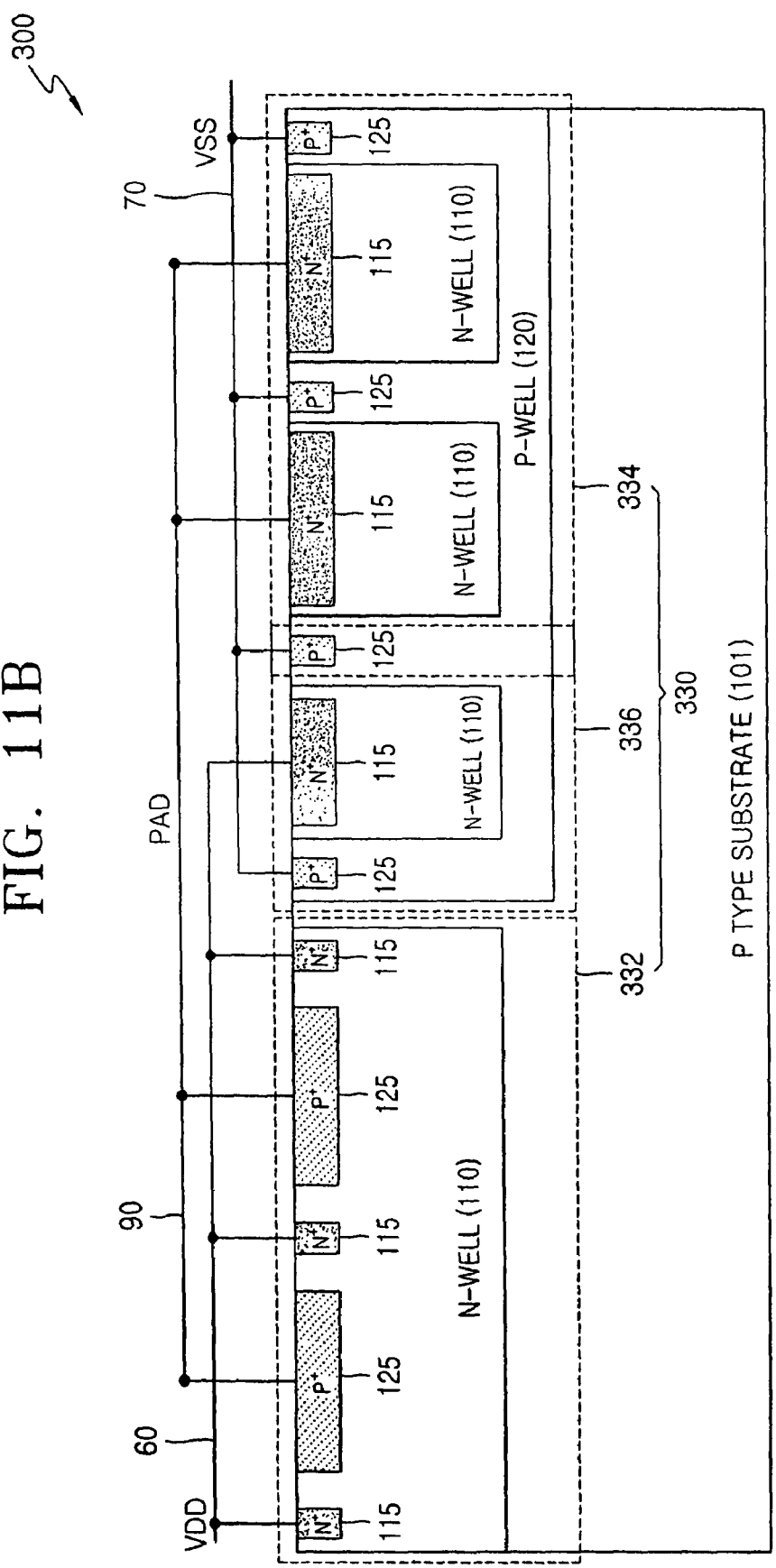
FIG. 11B is a sectional view taken along the B-B' line of FIG. 11A.

FIG. 11A shows a layout of an I/O ESD protection cell 330 constituting an integrated circuit device 300 according to a third embodiment of the present invention, and FIG. 11B is a sectional view taken along the B-B' line of FIG. 11A. The I/O ESD protection cell 330 of the third embodiment is different from that of the second embodiment in that a power clamp element 336 is arranged to partially overlap a $V_{SS}$ ESD protection element 334. In this case, there is an advantage in that a region for forming the I/O ESD protection cell 330 can be minimized. That is, the third embodiment can be effectively adapted for a realization of the I/O ESD protection cell 330 having a desired ESD protection function in a fast integrated circuit device 300 having a very small-sized I/O ESD protection cell 330.

The power clamp element 336 and the $V_{SS}$ ESD protection element 334 partially share the P-well 120 and the P+ active region 125. The $V_{DD}$ ESD protection element 332 is the same as that of the second embodiment.

Figure 12:
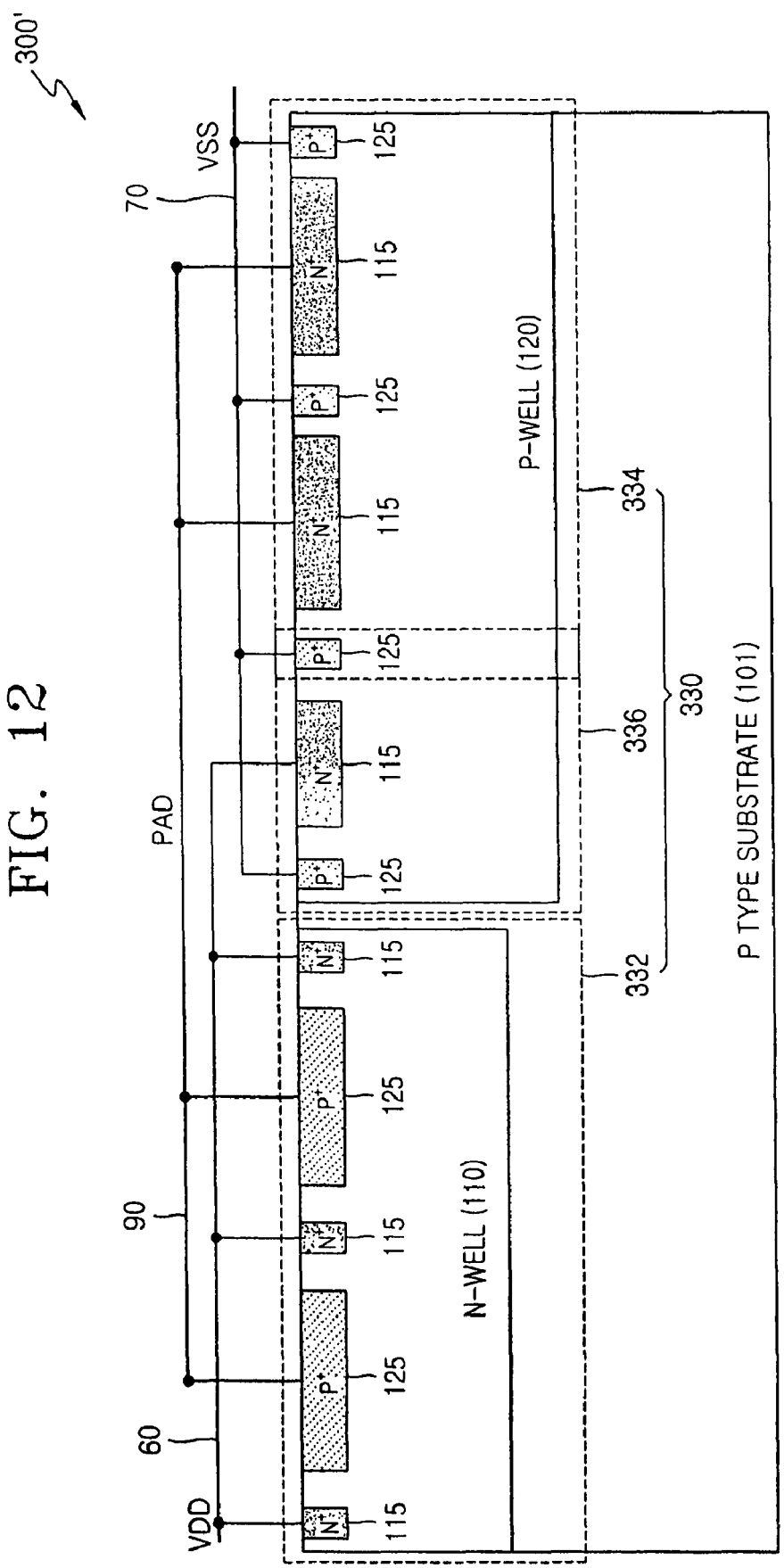
FIG. 12 is a sectional view showing a modified example of the third embodiment of the present invention.

FIG. 12 is a sectional view showing a modified example 300' of the third embodiment where a power clamp element 336 and a $V_{SS}$ ESD protection element 334 are formed in the P-well 120 without an N-well.

Figure 13A:
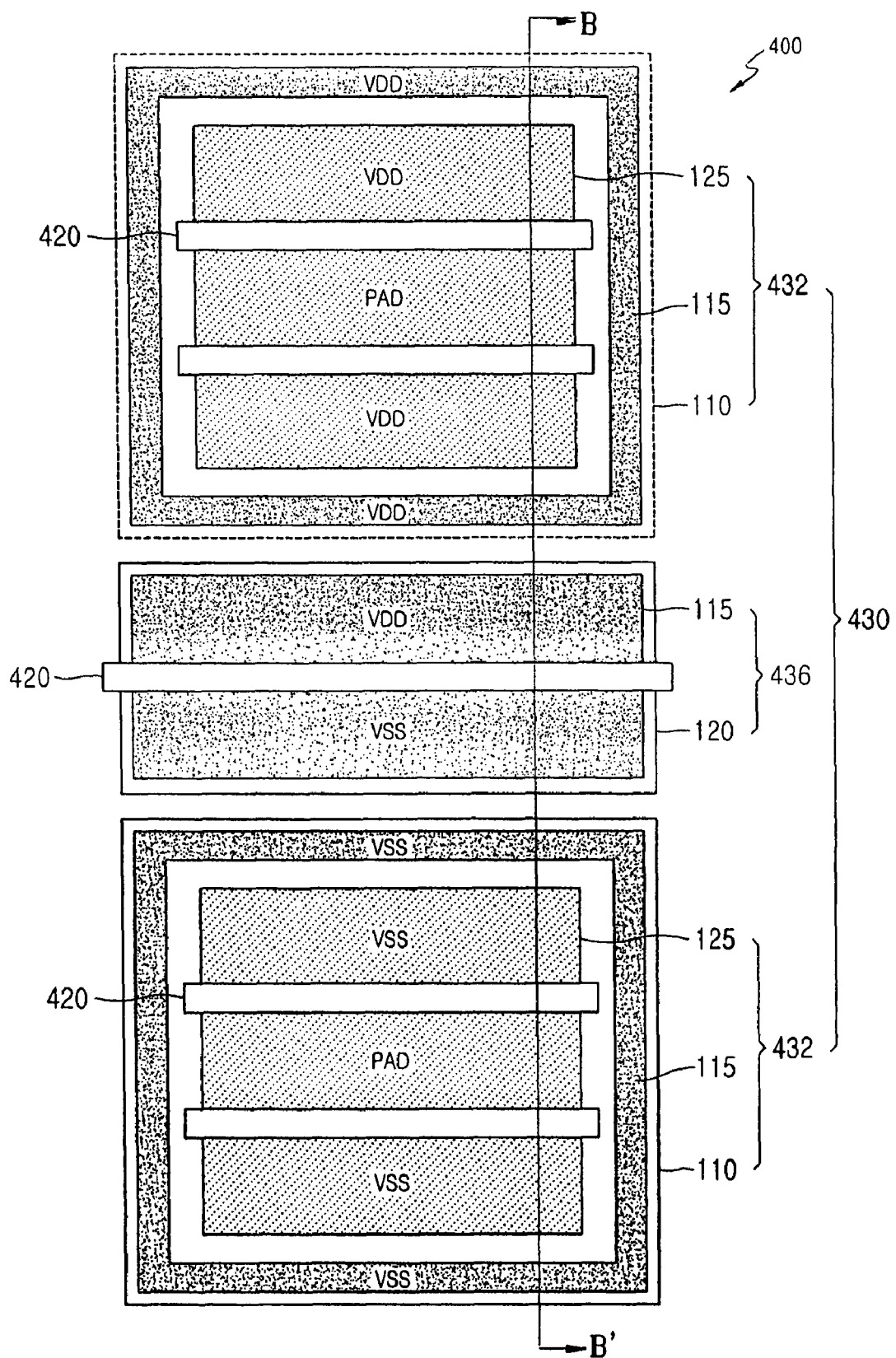
FIG. 13A shows a layout of an I/O ESD cell constituting an integrated circuit device according to a fourth embodiment of the present invention.
Figure 13B:
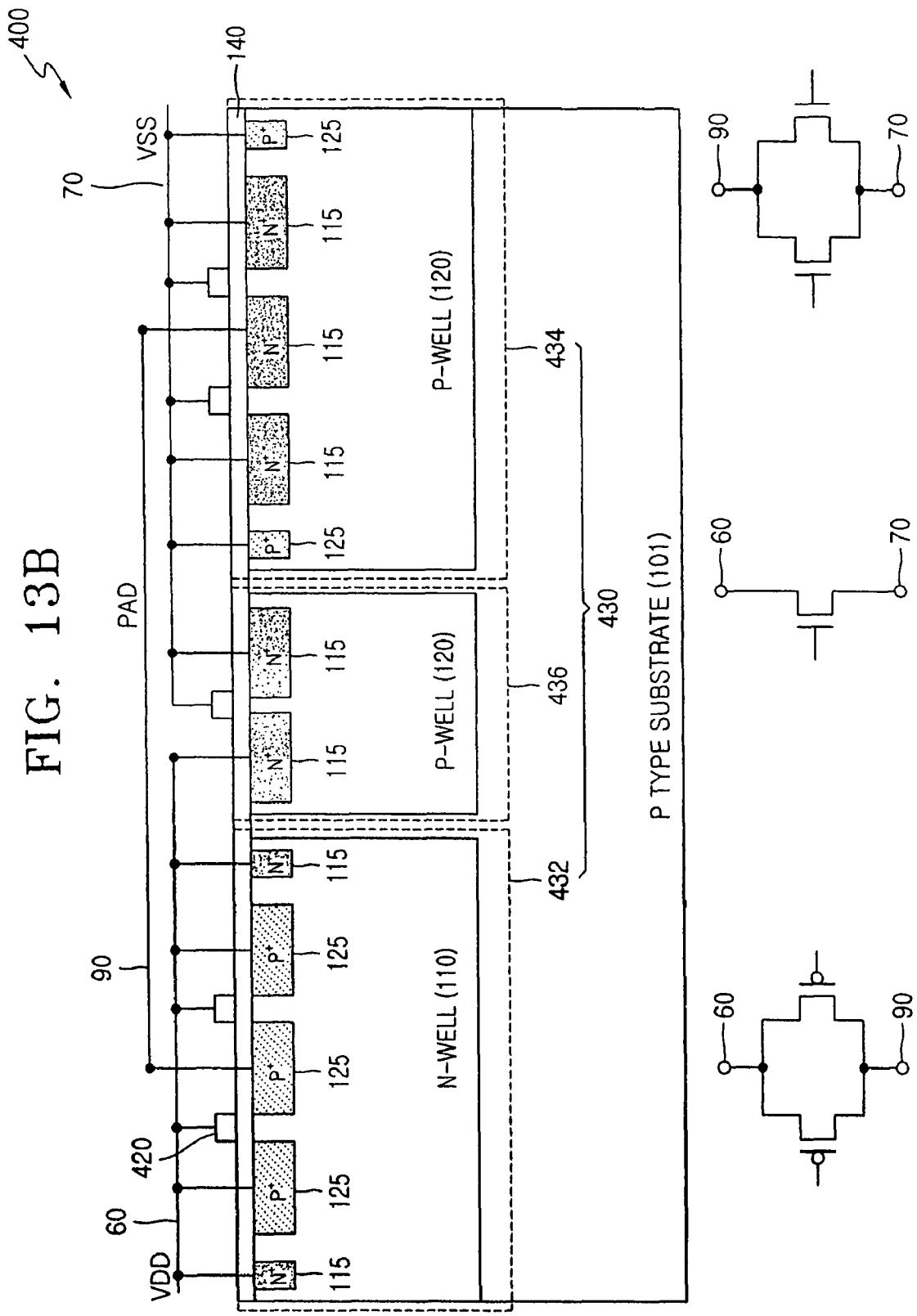
FIG. 13B is a sectional view taken along the B-B' line of FIG. 13A.

FIG. 13A shows a layout of an I/O ESD protection cell 430 constituting an integrated circuit device 400 according to a fourth embodiment of the present invention, and FIG. 13B is a sectional view taken along the B-B' line of FIG. 13A.

The I/O ESD protection cell 430 of the fourth embodiment is different from that of each of the first through third embodiments in that a power clamp element 436, a $V_{DD}$ ESD protection element 432, and a $V_{SS}$ ESD protection element 434 comprise MOS transistors.

As shown in circuit diagrams of FIG. 13B, when each of the $V_{DD}$ ESD protection element 432 and the $V_{SS}$ ESD protection element 434 comprises two MOS transistors connected to each other in parallel, the ESD current path is divided and the ESD protection function is thus improved. While the drawings have illustrated a case where two MOS transistors are connected to each other in parallel, if possible, more than two MOS transistors are preferably connected to one another in parallel.

In the I/O ESD cell 430 of an integrated circuit 400 device according to the fourth embodiment, the power clamp element 436 is separated from the $V_{DD}$ ESD protection element 432 and the $V_{SS}$ ESD protection element 434.

Each of the protection elements 432 and 434 and the power clamp element 436 is formed within its own separate well formed on the P-type substrate 101. The $V_{DD}$ ESD protection element 432 is formed in the N-well 110, the $V_{SS}$ ESD protection element 434 is formed in the P-well 120, and the power clamp element 436 is formed in the P-well 120.

The $V_{DD}$ ESD protection element 432 comprises a PMOS transistor comprising the P+ active regions 125, which are separated from one another to define a channel region, and a gate electrode 420 formed by interposing a gate oxide film 410 on the channel region. Among three P+ active regions 125 which are separated from one another, the central P+ active region 125 is connected to the I/O pad 90 and the other P+ active regions 125 are connected to the $V_{DD}$ line 60 to function as a source/drain. The gate electrode 420 is connected to the $V_{DD}$ line 60 to prevent the PMOS transistor from turning on during a normal operation. The N+ active region 115 is separated from the P+ active regions 125 and formed to surround all of the P+ active regions 125 in a closed-loop form. In addition, the N+ active region 115 is connected to the $V_{DD}$ line 60, and acts as a diode together with the I/O pad 90 during an ESD operation and acts to prevent latch-up during a normal operation.

The $V_{SS}$ ESD protection element 434 comprises a NMOS transistor comprising the N+ active regions 115, which are separated from one another to define a channel region, and a gate electrode 420 formed by interposing a gate oxide film 410 on the channel region. Among three N+ active regions 115 which are separated from one another, the central N+ active region 115 is connected to the I/O pad 90 and the other N+ active regions 115 are connected to the $V_{SS}$ line 70 to function as a source/drain. The gate electrode 420 is connected to the $V_{SS}$ line 70 to prevent the NMOS transistor from turning on during a normal operation. The P+ active region 125 is separated from the N+ active regions 115 and formed to surround all of the N+ active regions 115 in a closed-loop form. In addition, the P+ active region 125 is connected to the $V_{SS}$ line 70, and acts as a diode together with the I/O pad 90 during an ESD operation and acts to prevent latch-up during a normal operation.

The power clamp element 436 comprises a NMOS transistor comprising the N+ active regions 115, which are separated from one another to define a channel region, and a gate electrode 420 formed by interposing a gate oxide film 410 on the channel region. Two N+ active regions 115 are connected to the $V_{DD}$ line 60 and the $V_{SS}$ line 70, respectively, to function as a source/drain. The gate electrode 420 is connected to the $V_{SS}$ line 70 to prevent the transistor from turning on during a normal operation.

While FIG. 13B illustrates a case where the power clamp element 436 is an NMOS transistor formed in the P-well 120, the power clamp element 436 may comprise a PMOS transistor composed of the P+ active region 115 formed in the N-well 110. If the power clamp element 436 comprises the PMOS transistor, the gate electrode 420 of the power clamp element 436 is connected to the $V_{DD}$ line 60 to prevent the transistor from turning on during a normal operation.

Figure 14:
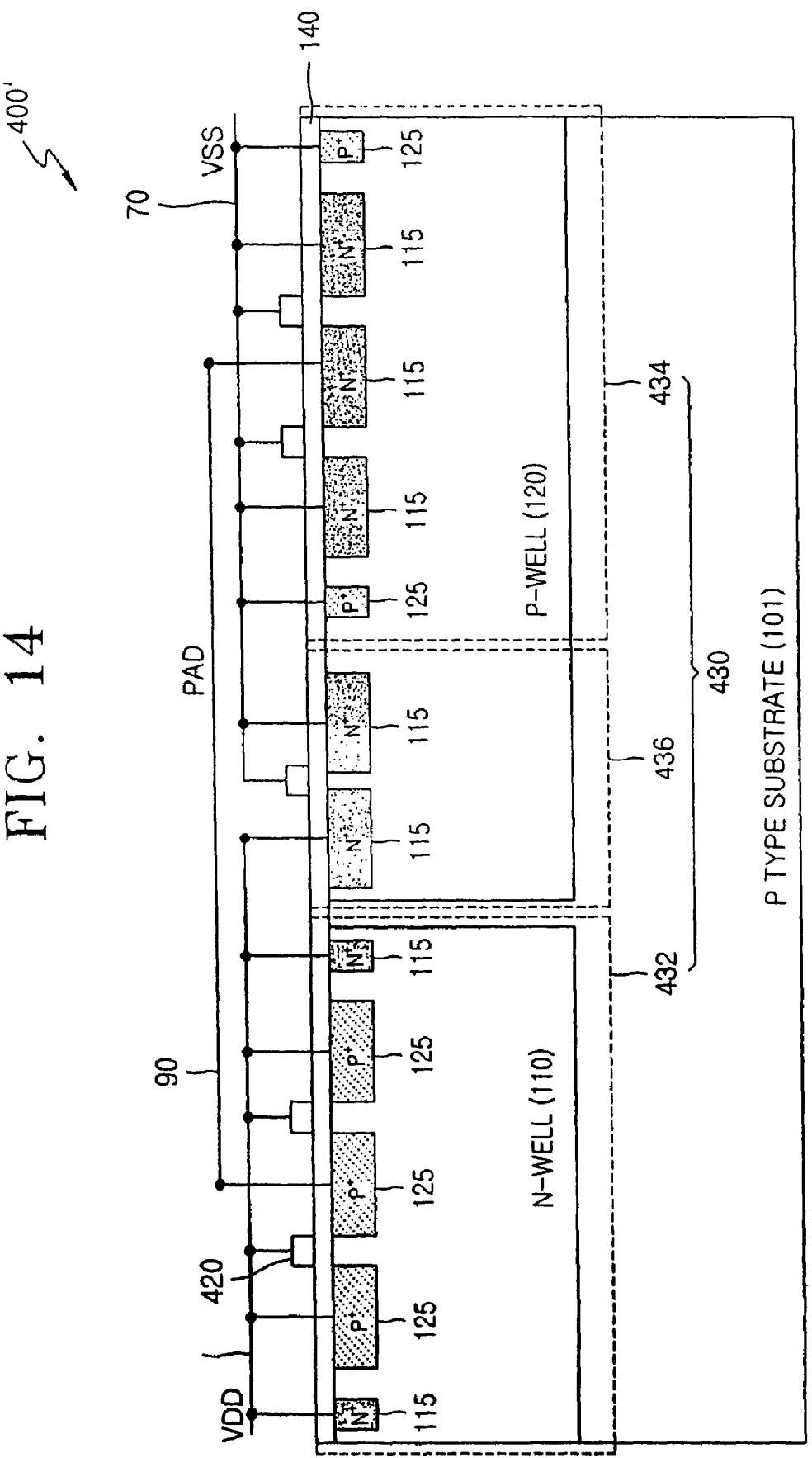
FIG. 14 is a sectional view showing a modified example of the fourth embodiment.

FIG. 14 is a sectional view showing a modified example 400' of the fourth embodiment where a $V_{SS}$ ESD protection element 434 and a power clamp element 436 are formed in a common P-well 120.

Meanwhile, in FIGS. 13A and 13B, when only the gate oxide film 410 on the channel region is substituted by a field oxide film, an I/O ESD protection cell comprising a field transistor can be formed.

The $V_{DD}$ ESD protection element, the power clamp element, and the $V_{SS}$ ESD protection element may comprise different components than those described above in connection with the exemplary embodiments. For example, the $V_{DD}$ ESD protection element and the $V_{SS}$ ESD protection element may comprise diodes, and the power clamp element may comprise transistors.

In addition, the layouts shown in FIGS. 5A through 5D for the $V_{DD}$ and $V_{SS}$ lines and the I/O pad, which are connected to elements constituting the I/O ESD protection cell of the second embodiment through fourth embodiment, may be modified to be suitable for each of the embodiments.

An integrated circuit device according to the exemplary embodiments of the present invention can handle a very large ESD current by forming ESD current shunt paths by means of power clamp elements with which each of the I/O ESD protection cells are equipped and by connecting the power clamp elements in parallel, although the size of the integrated circuit device decreases and thus the area of each of the I/O ESD protection cells becomes smaller. Therefore, according to the present invention, it is possible to provide an integrated circuit device that uses areas efficiently and has a stable ESD protection function. Specifically, it has been confirmed that an LDI product according to the present invention satisfies HBM 4000V/MM 500V evaluation standards.

While the present invention has been described with reference to exemplary embodiments thereof, it will be understood by those skilled in the art that various changes in form and details may be made therein without departing from the scope of the present invention as defined by the following claims.

What is claimed is:

1. An integrated circuit device having an I/O ESD protection cell, wherein the I/O ESD protection cell comprises:
   a power supply voltage ($V_{DD}$) ESD protection element formed within a second conductivity type well in a first conductivity type substrate and comprising a first conductivity type active region connected to an I/O pad and a second conductivity type active region connected to a $V_{DD}$ line;
   a power clamp element formed within the second conductivity type well in the first conductivity type substrate and comprising the second conductivity type active region connected to the $V_{DD}$ line and the first conductivity type active region connected to a ground voltage ($V_{SS}$) line; and
   a $V_{SS}$ ESD protection element formed within a first conductivity type well in the first conductivity type substrate and comprising the first conductivity type active region connected to the $V_{SS}$ line and the second conductivity type active region connected to the I/O pad.

2. The integrated circuit device of claim 1, wherein the power clamp element is arranged between the $V_{DD}$ ESD protection element and the $V_{SS}$ ESD protection element.

3. The integrated circuit device of claim 1, wherein the $V_{SS}$ ESD protection element further comprises the second conductivity type well surrounding the second conductivity type active region.

4. The integrated circuit device of claim 1, wherein at least a portion of the I/O ESD protection cell is formed below the I/O pad.

5. The integrated circuit device of claim 1, wherein the I/O ESD protection cell is formed below the I/O pad.

6. The integrated circuit device of claim 1, wherein the first conductivity type active region of the $V_{DD}$ ESD protection element is divided into at least two regions, each of the regions being connected to the I/O pad, and the second conductivity type active region is separated from the first conductivity type active region divided into at least two regions and surrounds the first conductivity type active region in a closed-loop form to form at least two diodes connected in parallel.

7. The integrated circuit device of claim 1, wherein the second conductivity type active region of the $V_{DD}$ ESD protection element is divided into at least two regions, each of the regions being connected to the I/O pad, and the first conductivity type active region is separated from the second conductivity type active region divided into at least two regions and surrounds the second conductivity type active region in a closed-loop form to form at least two diodes connected in parallel.

8. The integrated circuit device of claim 1, wherein the second conductivity type active region of the power clamp element is separated from the first conductivity type active region and surrounds the first conductivity type active region in a closed-loop form.

9. An integrated circuit device having an I/O ESD protection cell, wherein the I/0 ESD protection cell comprises:
   a power supply voltage ($V_{DD}$) ESD protection element formed within a second conductivity type well in a first conductivity type substrate and comprising a first conductivity type active region connected to an I/O pad and a second conductivity type active region connected to a $V_{DD}$ line;
   a power clamp element formed within a first conductivity type well in the first conductivity type substrate and comprising the second conductivity type active region connected to the $V_{DD}$ line and the first conductivity type active region connected to a ground voltage ($V_{SS}$) line; and
   a $V_{SS}$ ESD protection element formed within the first conductivity type well in the first conductivity type substrate and comprising the first conductivity type active region connected to the $V_{SS}$ line and the second conductivity type active region connected to the I/O pad.

10. The integrated circuit device of claim 9, wherein the power clamp element is arranged between the $V_{DD}$ ESD protection element and the $V_{SS}$ ESD protection element.

11. The integrated circuit device of claim 9, wherein the $V_{SS}$ ESD protection element and the power clamp element further comprise the second conductivity type well surrounding the second conductivity type active region.

12. The integrated circuit device of claim 9, wherein at least a portion of the I/O ESD protection cell is formed below the I/O pad.

13. The integrated circuit device of claim 9, wherein the I/O ESD protection cell is formed below the I/O pad.

14. The integrated circuit device of claim 9, wherein the first conductivity type active region of the $V_{DD}$ ESD protection element is divided into at least two regions, each of the regions being connected to the I/O pad, and the second conductivity type active region is separated from the first conductivity type active region divided into at least two regions and surrounds the first conductivity type active region in a closed-loop form to form at least two diodes connected in parallel.

15. The integrated circuit device of claim 9, wherein the second conductivity type active region of the $V_{DD}$ ESD protection element is divided into at least two regions, each of the regions being connected to the I/O pad, and the first conductivity type active region is separated from the second conductivity type active region divided into at least two regions and surrounds the second conductivity type active region in a closed-loop form to form at least two diodes connected in parallel.

16. The integrated circuit device of claim 9, wherein the first conductivity type active region of the power clamp element is separated from the second conductivity type active region and surrounds the second conductivity type active region in a closed-loop form.

17. The integrated circuit device of claim 9, wherein the power clamp element and the $V_{SS}$ ESD protection element share a portion of the first conductivity type active region.

18. An integrated circuit device having an I/O ESD protection cell, wherein the I/O ESD protection cell comprises:
a power supply voltage ($V_{DD}$) ESD protection element comprising first conductivity type active regions and a first gate, wherein the first conductivity type active regions are formed within a second conductivity type well in a first conductivity type substrate and separated from one another to define a first channel region, at least one of the first conductivity type active regions being connected to an I/O pad and the other being connected to a $V_{DD}$ line, and the first gate is formed on the first channel region;
a power clamp element comprising second conductivity type active regions and a second gate, wherein the second conductivity type active regions are formed within a first conductivity type well in the first conductivity type substrate and separated from one another to define a second channel region, at least one of the second conductivity type active regions being connected to the $V_{DD}$ line and the other being connected to a $V_{SS}$ line, and the second gate being formed on the second channel region; and
a $V_{SS}$ ESD protection element comprising the second conductivity type active regions and a third gate, wherein the second conductivity type active regions are formed within the first conductivity type well in the first conductivity type substrate and separated from one another to define a third channel region, at least one of the second conductivity type active regions being connected to an I/O pad and the other being connected to, the $V_{SS}$ line, and the third gate being formed on the third channel region.

19. The integrated circuit device of claim 18, wherein the elements are MOS transistors or field transistors.

20. The integrated circuit device of claim 18, wherein the power clamp element is arranged between the $V_{DD}$ ESD protection element and the $V_{SS}$ ESD protection element.

21. The integrated circuit device of claim 18, wherein at least a portion of the I/O ESD protection cell is formed below the I/O pad.

22. The integrated circuit device of claim 18, wherein the I/O ESD protection cell is formed below the I/O pad.

23. The integrated circuit device of claim 18, wherein the $V_{DD}$ ESD protection element further comprises the second conductivity type active region separated from all of the first conductivity type active regions, formed to surround all of the first conductivity type active regions in a closed-loop form, and connected to the $V_{DD}$ line.

24. The integrated circuit device of claim 18, wherein the $V_{SS}$ ESD protection element further comprises the first conductivity type active region separated from all of the second conductivity type active regions, formed to surround all of the second conductivity type active regions in a closed-loop form, and connected to the $V_{SS}$ line.

25. The integrated circuit device of claim 18, wherein the first conductivity type active region of the $V_{DD}$ ESD protection element is divided into at least three regions, where the central region is connected to the I/O pad and the other are connected to the $V_{DD}$ line to form at least two transistors connected in parallel.

26. The integrated circuit device of claim 18, wherein the second conductivity type active region of the $V_{SS}$ ESD protection element is divided into at least three regions, where the central region is connected to the I/O pad and the other are connected to the $V_{DD}$ line to form at least two transistors connected in parallel.

27. The integrated circuit device of claim 18, wherein the first gate is connected to the $V_{DD}$ line, the second gate formed on the second channel region defined by the second conductivity type active regions is connected to the $V_{SS}$ line, the second gate formed on the second channel region defined by the first conductivity type active regions is connected to the $V_{DD}$ line, and the third gate is connected to the $V_{SS}$ line.

28. An integrated circuit device having an I/O ESD protection cell, wherein the I/O ESD protection cell comprises:
a power supply voltage ($V_{DD}$) ESD protection element comprising first conductivity type active regions and a first gate, wherein the first conductivity type active regions are formed within a second conductivity type well in a first conductivity type substrate and separated from one another to define a first channel region, at least one of the first conductivity type active regions being connected to an I/O pad and the other being connected to a $V_{DD}$ line, and the first gate is formed on the first channel region;
a power clamp element comprising the first conductivity type active regions and a second gate, wherein the first conductivity type active regions are formed within the second conductivity type well in the first conductivity type substrate and separated from one another to define the second channel region, at least one of the first conductivity type active regions being connected to the $V_{DD}$ line and the other being connected to the $V_{SS}$ line, and the second gate being formed on the second channel region; and a $V_{SS}$ ESD protection element comprising the second conductivity type active regions and a third gate, wherein the second conductivity type active regions are formed within the first conductivity type well in the first conductivity type substrate and separated from one another to define a third channel region, at least one of the second conductivity type active regions being connected to an I/O pad and the other being connected to the $V_{SS}$ line, and the third gate being formed on the third channel region.

29. The integrated circuit device of claim 28, wherein the elements are MOS transistors or field transistors.

30. The integrated circuit device of claim 28, wherein the power clamp element is arranged between the $V_{DD}$ ESD protection element and the $V_{SS}$ ESD protection element.

31. The integrated circuit device of claim 28, wherein at least a portion of the I/O ESD protection cell is formed below the I/O pad.

32. The integrated circuit device of claim 28, wherein the I/O ESD protection cell is formed below the I/O pad.

33. The integrated circuit device of claim 28, wherein the $V_{DD}$ ESD protection element further comprises the second conductivity type active region separated from all of the first conductivity type active regions, formed to surround all of the first conductivity type active regions in a closed-loop form, and connected to the $V_{DD}$ line.

34. The integrated circuit device of claim 28, wherein the $V_{SS}$ ESD protection element further comprises the first conductivity type active region separated from all of the second conductivity type active regions, formed to surround all of the second conductivity type active regions in a closed-loop form, and connected to the $V_{SS}$ line.

35. The integrated circuit device of claim 28, wherein the first conductivity type active region of the $V_{DD}$ ESD protection element is divided into at least three regions, where the central region is connected to the I/O pad and the other are connected to the $V_{DD}$ line to form at least two transistors connected in parallel.

36. The integrated circuit device of claim 28, wherein the second conductivity type active region of the $V_{SS}$ ESD protection element is divided into at least three regions, where the central region is connected to the I/O pad and the other are connected to the $V_{DD}$ line to form at least two transistors connected in parallel.

37. The integrated circuit device of claim 28, wherein the first gate is connected to the $V_{DD}$ line, the second gate formed on the second channel region defined by the second conductivity type active regions is connected to the $V_{SS}$ line, the second gate formed on the second channel region defined by the first conductivity type active regions is connected to the $V_{DD}$ line, and the third gate is connected to the $V_{SS}$ line.

* * * * *